United States Patent [19]
McTeer

[11] Patent Number: 5,939,788
[45] Date of Patent: Aug. 17, 1999

[54] COPPER DIFFUSION BARRIER, ALUMINUM WETTING LAYER AND IMPROVED METHODS FOR FILLING OPENINGS IN SILICON SUBSTRATES WITH COOPER

[75] Inventor: Allen McTeer, Meridan, Id.

[73] Assignee: Micron Technology, Inc., Boise, Id.

[21] Appl. No.: 09/038,221

[22] Filed: Mar. 11, 1998

[51] Int. Cl.$^6$ .................................................. H01L 23/48
[52] U.S. Cl. ...................... 257/751; 257/752; 257/764; 257/763; 257/762; 438/597; 438/624; 438/149; 438/151
[58] Field of Search ..................................... 257/752, 751, 257/737, 764, 768, 763, 760, 765, 774, 759, 758, 762; 438/592, 622, 634, 624, 636, 675, 738, 300, 154, 166, 151, 712, 717

[56] References Cited

U.S. PATENT DOCUMENTS

| | | |
|---|---|---|
| 4,985,750 | 1/1991 | Hoshino . |
| 5,231,306 | 7/1993 | Meikle et al. . |
| 5,243,222 | 9/1993 | Harper et al. . |
| 5,371,042 | 12/1994 | Ong . |
| 5,380,678 | 1/1995 | Yu et al. . |
| 5,527,739 | 6/1996 | Parrillo et al. . |
| 5,559,817 | 9/1996 | Derkits, Jr. et al. . |
| 5,595,937 | 1/1997 | Mikagi . |
| 5,602,053 | 2/1997 | Zheng et al. ............... 257/355 |
| 5,602,423 | 2/1997 | Jain .......................... 257/752 |
| 5,612,254 | 3/1997 | Mu et al. . |
| 5,614,765 | 3/1997 | Avanzino et al. ............ 257/774 |
| 5,646,448 | 7/1997 | Klein et al. . |
| 5,654,216 | 8/1997 | Adrian . |
| 5,654,232 | 8/1997 | Gardner . |
| 5,668,054 | 9/1997 | Sun et al. . |
| 5,700,716 | 12/1997 | Sharan et al. . |
| 5,708,303 | 1/1998 | Jeng .......................... 257/758 |
| 5,877,076 | 3/1999 | Dai ............................ 438/597 |
| 5,882,958 | 3/1999 | Wanlass ..................... 438/149 |
| 5,882,996 | 3/1999 | Dai ............................ 438/597 |
| 5,883,006 | 3/1999 | Iba ............................. 438/712 |

*Primary Examiner*—Carl Whitehead, Jr.
*Attorney, Agent, or Firm*—Killworth, Gottman, Hagan & Schaeff, L.L.P.

[57] ABSTRACT

Improved methods for filling openings in silicon substrates with copper and the metal interconnects so produced are provided. One method involves the use of a $Ti_xAl_yN_z$ barrier layer which is stable to the high temperatures required to reflow copper after PVD deposition. Another method involves the use of an aluminum wetting layer between a barrier layer and the copper which effectively lowers the temperature at which copper reflows and therefore allows the use of typical barrier layers.

61 Claims, 8 Drawing Sheets

COPPER DIFFUSION BARRIER, ALUMINUM WETTING LAYER AND IMPROVED METHODS FOR FILLING OPENINGS IN SILICON SUBSTRATES WITH COOPER

FIELD OF THE INVENTION

This invention in general relates to semiconductor device fabrication, and more particularly to a novel copper diffusion barrier, an aluminum wetting layer for copper, and methods of filling openings, including high aspect ratio openings, in silicon substrates with copper.

BACKGROUND OF THE INVENTION

As the demand for cheaper, faster, lower power consuming microprocessors increases, so must the device packing density of the integrated circuit. Very large scale integration (VLSI) techniques have continually evolved to meet the increasing demand. All aspects of the integrated circuit must be scaled down to fully minimize the device dimensions of the integrated circuit. In addition to minimizing transistor dimensions, one must minimize the dimensions of the electrical interconnections, which integrate the semiconductor devices, such as transistors, together on a microchip in order to form a complete circuit.

Currently, aluminum alloys are the most commonly used conductive materials for electrical interconnections in a VLSI integrated circuit. Aluminum and its alloys have been fully characterized for use as electrical interconnections, and much technology has been developed to aid in the formation of aluminum interconnections. While aluminum has very attractive features for use as an electrical interconnection such as low electrical resistivity and strong adhesion to silicon dioxide ($SiO_2$), as VLSI dimensions reach into the deep-submicron Ultra Large Scale Integration (ULSI) regime, the deficiencies of aluminum and its alloys become limiting factors in achieving superior performance. For example, as the width of electrical interconnections becomes narrower, the resistance of aluminum becomes non-negligible and begins to contribute significantly to the resistance-capacitance (RC) time delay of the circuit. Additionally, with decreasing dimensions, design rules become increasingly restricted by aluminum interconnection reliability concerns such as electromigration, stress-induced void formation, hillock suppression, and current density limitations.

For these reasons, the microelectronics industry has recently migrated towards the investigation of more robust, more conductive metals for use in interconnection technology such as Copper (Cu). Cu is approximately 40% lower in resistivity than Al and has fewer reliability concerns such as electromigration.

However, a disadvantage in the use of Cu and its alloys for interconnection applications is that a manufacturable dry-etch process has not been demonstrated that can pattern Cu-based materials using standard photolithographic techniques. Therefore, to implement the use of Cu as a microelectronic interconnection material it has become necessary to develop alternate patterning techniques.

One technique is known as damascene. In damascene, a dielectric layer is deposited onto a substrate, patterned, and etched back such that grooves, vias, and other recessed regions etched into the dielectric layer represent the desired metal interconnection pattern. A conductive metal is then desposited over the entire surface of the device, filling the recessed regions and blanketing the surface of the dielectric layer. Next, the conductive material is polished back to a degree such that the conductive material becomes electrically isolated within the recessed regions etched out of the dielectric material.

An inadequately filled recessed region in a damascene process flow leads to the creation of a void or tunnel. Voids significantly degrade semiconductor device yields thereby adding to the total manufacturing cost. Gaps and void can cause significant problems in a semiconductor manufacturing process and are considerable issues for sputtered and evaporated films. One problem with gaps and voids is that they can trap impurities, such as etchant chemicals, which can harm the semiconductor device in subsequent process steps. Trapped impurities may then contaminate the semiconductor device which could degrade reliability. Trapped etchant chemicals may also continue to etch the electrical interconnection resulting in the thinning of electrical interconnections or the creation of a electrical open, thereby resulting in a failure. Interconnection thinning may lead to reliability problems such as electromigration and current-carrying limitations. Additionally, trapped contaminates may expand upon subjecting the semiconductor substrate to subsequent high temperature processing steps. Such expansion could cause significant damage to adjoining surface features of the semiconductor device. Finally, trapped contaminants may escape during a subsequent process step conducted within a process chamber, thereby contaminating all other semiconductor devices within the chamber.

The potential for forming voids is greatly increased by attempting to fill grooves of significantly varying widths together on a single substrate at the same interconnection level using deposition processes with relatively high sticking coefficients. This is because these deposition processes are typically optimized to fill a groove of a particular width. While such optimization techniques may be suitably employed to fill interconnections of this particular width on a semiconductor substrate, the problem is that grooves of widths for which the process has not been optimized run a much higher risk of void formation. This makes interconnection technology dependent on individual device layout. Such dependence degrades the manufacturability of such processes.

It is currently more desirable to form copper interconnections on a semiconductor substrate by Cu sputtering rather than by CVD of Cu. One reason why Cu sputtering is more desirable is that there is a significant cost associated with performing CVD of Cu. Equipment necessary to form CVD Cu layers is currently under development and not yet readily available for high production manufacturing environments. Additionally, the materials necessary to deposit CVD Cu layers are expensive, still under investigation, and the films are not likely to be very pure. Therefore, CVD of Cu is expensive and considerably adds to the total manufacturing cost of a semiconductor device. Furthermore, while some CVD techniques which exhibit low sticking coefficients may be capable of minimizing void formation, seams are still formed along the center of the CVD layers within the grooves. Seams are formed when deposited materials on laterally opposing walls within a groove grow into each other. These seams may be undesirable due to, for example, their negative impact on the grain size of the conductive layer and their susceptibility to trapping impurities. Finally, CVD techniques which exhibit low sticking coefficients also exhibit low deposition rates. Therefore, in the interest of manufacturability, higher sticking coefficient CVD processes are typically used to accelerate throughput time. However, these higher sticking coefficient CVD processes exhibit the same short-comings as the high sticking coefficient processes discussed above.

Existing sputter deposition (PVD) systems can easily and cheaply deposit Cu layers. However, sputter deposition systems have exhibited significant limitations in their ability to fill recessed regions in a damascene process flow as discussed above. Grooves, openings, etc. with aspect ratios below 0.5 are generally adequately filled without the aid of a reflow process. However, the reflow process additionally serves to improve the step coverage and general film quality of these wide lines. High aspect ratio openings, on the other hand, do require a reflow step to eliminate gaps and voids within the copper layer. These limitations have restricted the applicability of sputter deposition systems in a damascene process.

Another disadvantage of copper metallization is that reaction and interdiffusion between Cu in the metallization film and Si included in the substrate, or Cu in the metallization film and Si in the insulating film occur during a heat treating process such as annealing or reflow steps. This is because the Cu metallization film is directly in contact with the Si substrate at the through holes in the insulating film. Reaction and interdiffusion cause an increase in the contact resistance and degradation of the Cu metallization. In addition, Cu in the silicon substrate also decreases minority carrier lifetimes which degrade the performance of the chip. For these reasons, barrier layers have been used to prevent the reaction and interdiffusion between Cu and Si. For example, U.S. Pat. No. 4,987,750 describes the use of titanium nitride (TiN), tungsten (W), tungsten nitride (WN), zirconium nitride (ZrN), titanium carbide (TiC), tungsten carbide (WC), tantalum (Ta), tantalum nitride (TaN) or titanium tungsten (TiW) barrier layers for copper.

However, these barrier layers exhibit instability at the higher temperatures (>500° C.) required to reflow copper into the trench for damascene. A reflow step, which is necessary when filling high aspect ratio openings, is a process step in which a conductive layer is exposed to an elevated temperature under vacuum for a period of time necessary to cause the conductive layer to "smooth out" and substantially seal gaps in the conductive material.

In order to overcome this limitation, certain materials have been deposited prior to deposition of copper which act as wetting agents. These agents serve to wet the copper layer in the opening by providing the copper layer with a low interfacial energy within the opening. For example, U.S. Pat. No. 5,654,232 describes the use of a silicon nitride or tantalum wetting layer to prevent copper from agglomerating out of an opening during a subsequent reflow step. It is thought that the driving force for the reflow of the copper layer into the opening is the minimization in surface free energy in combination with sidewalls comprising these wetting layers. These wetting layers are thought to provide the copper layer with a low interfacial energy within the opening and to actually physically draw the copper layer into the opening.

Therefore, in the fabrication of silicon substrates, there exists a need for improved methods of filling openings, including high aspect ratio openings. More particularly, there exists a need for a barrier layer which is stable to the high temperatures required to reflow copper after PVD deposition, and there exists a need for a wetting layer which effectively lowers the temperature at which the copper reflows and therefore, allows the use of typical barrier layers.

SUMMARY OF THE INVENTION

Those needs are met by the present invention. Thus, one aspect of the present invention provides for a $Ti_xAl_yN_z$ barrier layer which is stable to the high temperatures required to reflow copper after PVD deposition, and another aspect of the present invention provides for an aluminum wetting layer which effectively lowers the temperature at which the copper reflows and therefore allows the use of typical barrier layers.

Therefore, in one embodiment of the present invention, there is provided a method for filling openings in silicon substrates which comprises depositing a copper diffusion barrier layer on the inside surface of the opening; depositing an aluminum wetting layer over the copper diffusion barrier layer; and depositing a copper layer over the aluminum wetting layer to fill the opening.

In another embodiment, there is provided a method for filling openings in silicon substrates which comprises depositing a $Ti_xAl_yN_z$ barrier layer on the inside surface of the opening; and depositing a copper layer over the $Ti_xAl_yN_z$ barrier layer to fill the opening.

In another embodiment, there is provided a process for forming a contact level dual damascene comprising providing a first and second insulating layer on a silicon substrate having an opening through said first and second insulating layers; depositing a refractory metal layer on the inside surface of the opening; depositing a $Ti_xAl_yN_z$ barrier layer over the refractory metal layer; and depositing a copper layer over the $Ti_xAl_yN_z$ barrier layer to fill the opening.

In still another embodiment, there is provided a process for forming a contact level dual damascene comprising providing a first and second insulating layer on a silicon substrate having an opening through said first and second insulating layers; depositing a refractory metal layer on the inside surface of the opening; depositing a copper diffusion barrier layer over the refractory metal layer; depositing an aluminum wetting layer over the copper diffusion barrier layer; and depositing a copper layer over the aluminum wetting layer to fill the opening.

In still another embodiment, there is provided a process for forming an interconnect on a silicon substrate which comprises providing a first insulating layer having a conductive metal plug therein; depositing a second insulating layer over the first insulating layer and the conductive metal plug; patterning the second insulating layer to form a patterned second insulating layer having an opening wherein the opening lies over at least part of the conductive metal plug; depositing a copper diffusion barrier layer on the inside surface of the opening; depositing an aluminum wetting layer over the copper diffusion barrier layer; depositing a copper layer over the aluminum wetting layer to fill the opening and form said interconnect; annealing the copper layer; and reflowing the copper.

In yet another embodiment, there is provided a process for forming an interconnect on a silicon substrate which comprises providing a first insulating layer having a conductive metal plug therein; depositing a second insulating layer over the first insulating layer and the conductive metal plug; patterning the second insulating layer to form a patterned second insulating layer having an opening wherein the opening lies over at least part of the conductive metal plug; depositing a $Ti_xAl_yN_z$ barrier layer on the inside surface of the opening; depositing a copper layer over the $Ti_xAl_yN_z$ barrier layer to fill the opening and form said interconnect; annealing the copper layer; and reflowing the copper.

In another embodiment, there is provided a process for forming a via level copper/copper dual damascene interconnect on a silicon substrate which comprises providing a first insulating layer having a conductive metal plug therein;

depositing a second insulating layer over the first insulating layer and the conductive metal plug; patterning the second insulating layer to form a patterned second insulating layer having a first opening wherein the first opening lies over at least part of the conductive metal plug; depositing a first $Ti_xAl_yN_z$ barrier layer on the inside surface of the first opening; depositing a first copper layer over the first $Ti_xAl_yN_z$ barrier layer to fill the first opening; planarizing the silicon substrate so formed; depositing a third insulating layer over the second insulating layer and the first copper layer; patterning the third insulating layer to form a patterned third insulating layer having a second opening wherein the second opening lies over at least part of the first copper layer; depositing a second $Ti_xAl_yN_z$ barrier layer on the inside surface of the second opening; depositing a second copper layer over the second $Ti_xAl_yN_z$ barrier layer to fill the second opening and form said copper/copper dual damascene interconnect; annealing the second copper layer; and reflowing the second copper layer.

In another embodiment, there is provided a process for forming a via level copper/copper dual damascene interconnect on a silicon substrate comprising providing a first insulating layer having a conductive metal plug therein; depositing a second insulating layer over the first insulating layer and the conductive metal plug; patterning the second insulating layer to form a patterned second insulating layer having a first opening wherein the first opening lies over at least part of the conductive metal plug; depositing a copper diffusion barrier layer on the inside surface of the opening; depositing an aluminum wetting layer over the copper diffusion barrier layer; depositing a first copper layer over the aluminum wetting layer to fill the opening; planarizing the silicon substrate so formed; depositing a third insulating layer over the second insulating layer and the first copper layer; patterning the third insulating layer to form a patterned third insulating layer having a second opening wherein the second opening lies over at least part of the first copper layer; depositing a $Ti_xAl_yN_z$ barrier layer on the inside surface of the second opening; depositing a second copper layer over the $Ti_xAl_yN_z$ barrier layer to fill the second opening and form said copper/copper dual damascene interconnect; annealing the second copper layer; and reflowing the second copper layer.

In another embodiment, there is provided a process for forming a via level copper/copper dual damascene interconnect on a silicon substrate comprising providing a first insulating layer having a conductive metal plug therein; depositing a second insulating layer over the first insulating layer and the conductive metal plug; patterning the second insulating layer to form a patterned second insulating layer having a first opening wherein the first opening lies over at least part of the conductive metal plug; depositing a $Ti_xAl_yN_z$ barrier layer on the inside surface of the first opening; depositing a first copper layer over the $Ti_xAl_yN_z$ barrier layer to fill the first opening; planarizing the silicon substrate so formed; depositing a third insulating layer over the second insulating layer and the first copper layer; patterning the third insulating layer to form a patterned third insulating layer having a second opening wherein the second opening lies over at least part of the first copper layer; depositing a copper diffusion barrier layer on the inside surface of the second opening; depositing an aluminum wetting layer over the copper diffusion barrier layer; depositing a second copper layer over the aluminum wetting layer to fill the second opening and form said copper/copper dual damascene interconnect; annealing the second copper layer; and reflowing the second copper layer.

In another embodiment, there is provided a process for forming a via level copper/copper dual damascene interconnect on a silicon substrate comprising providing a first insulating layer having a conductive metal plug therein; depositing a second insulating layer over the first insulating layer and the conductive metal plug; patterning the second insulating layer to form a patterned second insulating layer having a first opening wherein the first opening lies over at least part of the conductive metal plug; depositing a first copper diffusion barrier layer on the inside surface of the first opening; depositing a first aluminum wetting layer over the first copper diffusion barrier layer; depositing a first copper layer over the first aluminum wetting layer to fill the first opening; planarizing the silicon substrate so formed; depositing a third insulating layer over the second insulating layer and the first copper layer; patterning the third insulating layer to form a patterned third insulating layer having a second opening wherein the second opening lies over at least part of the first copper layer; depositing a second copper diffusion barrier layer on the inside surface of the second opening; depositing a second aluminum wetting layer over the second copper diffusion barrier layer; depositing a second copper layer over the second aluminum wetting layer to fill the second opening and form said copper/copper dual damascene interconnect; annealing the second copper layer; and reflowing the second copper layer.

In another embodiment, there is provided a process for forming a via level aluminum/copper dual damascene interconnect on a silicon substrate comprising providing a first insulating layer having a conductive metal plug therein; depositing a second insulating layer over the first insulating layer and the conductive metal plug; patterning the second insulating layer to form a patterned second insulating layer having a first opening wherein the first opening lies over at least part of the conductive metal plug; depositing a wetting layer for aluminum on the inside surface of the first opening; depositing a first aluminum layer over the wetting layer for aluminum to fill the first opening; planarizing the silicon substrate so formed; depositing a third insulating layer over the second insulating layer and the first aluminum layer; patterning the third insulating layer to form a patterned third insulating layer having a second opening wherein the second opening lies over at least part of the first aluminum layer; depositing a copper diffusion barrier layer on the inside surface of the second opening; depositing an aluminum wetting layer over the copper diffusion barrier layer; depositing a copper layer over the aluminum wetting layer to fill the second opening and form said aluminum/copper dual damascene interconnect; annealing the copper layer; and reflowing the copper layer.

In another embodiment, there is provided a process for forming a via level aluminum/copper dual damascene interconnect on a silicon substrate comprising providing a first insulating layer having a conductive metal plug therein; depositing a second insulating layer over the first insulating layer and the conductive metal plug; patterning the second insulating layer to form a patterned second insulating layer having a first opening wherein the first opening lies over at least part of the conductive metal plug; depositing an aluminum diffusion barrier layer on the inside surface of the first opening; depositing a wetting layer for aluminum over the aluminum diffusion barrier layer; depositing an aluminum layer over the wetting layer for aluminum to fill the first opening; planarizing the silicon substrate so formed; depositing a third insulating layer over the second insulating layer and the aluminum layer; patterning the third insulating layer to form a patterned third insulating layer having a second opening wherein the second opening lies over at least part of the aluminum layer; depositing a copper diffusion barrier layer on the inside surface of the second opening; depositing an aluminum wetting layer over the copper diffusion barrier layer; depositing a copper layer over the aluminum wetting layer to fill the second opening and form said aluminum/copper dual damascene interconnect; annealing the copper layer; and reflowing the copper layer.

In another embodiment, there is provided a process for forming a via level aluminum/copper dual damascene interconnect on a silicon substrate comprising providing a first insulating layer having a conductive metal plug therein; depositing a second insulating layer over the first insulating layer and the conductive metal plug; patterning the second insulating layer to form a patterned second insulating layer having a first opening wherein the first opening lies over at least part of the conductive metal plug; depositing a wetting layer for aluminum on the inside surface of the first opening; depositing an aluminum layer over the wetting layer for aluminum to fill the first opening; planarizing the silicon substrate so formed; depositing a third insulating layer over the second insulating layer and the aluminum layer; patterning the third insulating layer to form a patterned third insulating layer having a second opening wherein the second opening lies over at least part of the aluminum layer; depositing a $Ti_xAl_yN_z$ barrier layer on the inside surface of the second opening; depositing a copper layer over the $Ti_xAl_yN_z$ barrier layer to fill the second opening and form said aluminum/copper dual damascene interconnect; annealing the copper layer; and reflowing the copper layer.

In another embodiment, there is provided a process for forming a via level aluminum/copper dual damascene interconnect on a silicon substrate comprising providing a first insulating layer having a conductive metal plug therein; depositing a second insulating layer over the first insulating layer and the conductive metal plug; patterning the second insulating layer to form a patterned second insulating layer having a first opening wherein the first opening lies over at least part of the conductive metal plug; depositing an aluminum diffusion barrier layer on the inside surface of the first opening; depositing a wetting layer for aluminum over the aluminum diffusion barrier layer; depositing an aluminum layer over the wetting layer for aluminum to fill the opening; planarizing the silicon substrate so formed; depositing a third insulating layer over the second insulating layer and the aluminum layer; patterning the third insulating layer to form a patterned third insulating layer having a second opening wherein the second opening lies over at least part of the aluminum layer; depositing a $Ti_xAl_yN_z$ barrier layer on the inside surface of the second opening; depositing a copper layer over the $Ti_xAl_yN_z$ barrier layer to fill the second opening and form said aluminum/copper dual damascene interconnect; annealing the copper layer; and reflowing the copper layer.

In still another embodiment, there is provided a silicon structure comprising an insulating layer deposited over a silicon substrate and having an opening therein; a $Ti_xAl_yN_z$ barrier layer deposited on the inside surface of the opening; and a copper layer deposited over the $Ti_xAl_yN_z$ barrier layer to fill the opening.

In still another embodiment, there is provided a silicon structure comprising an insulating layer deposited over a silicon substrate and having an opening therein; a copper diffusion barrier layer deposited on the inside surface of the opening; an aluminum wetting layer deposited over the copper diffusion barrier layer; and a copper layer deposited over the aluminum wetting layer to fill the opening, wherein said aluminum wetting layer consists at least in part of a copper aluminum alloy after the copper layer is deposited over the aluminum wetting layer.

In still another embodiment, there is provided a contact level dual damascene comprising a first insulating layer deposited over a silicon substrate and having an opening therein; a second insulating layer deposited over the first insulating layer and having an opening therein, wherein the opening in the second insulating layer lies over at least part of the opening in the first insulating layer to form an opening through the first and second insulating layers; a refractory metal layer deposited on the inside surface of the opening through the first and second insulating layers; a $Ti_xAl_yN_z$ barrier layer deposited over the refractory metal layer; and a copper layer deposited over the $Ti_xAl_yN_z$ barrier layer to fill the opening through the first and second insulating layers, wherein at least a portion of said silicon substrate lying directly below the refractory metal layer consists at least in part of a refractory metal silicide $MSi_x$ after the refractory metal layer is deposited on the inside surface of the opening through the first and second insulating layers.

In still another embodiment, there is provided a contact level dual damascene comprising a first insulating layer deposited over a silicon substrate and having an opening therein; a second insulating layer deposited over the first insulating layer and having an opening therein, wherein the opening in the second insulating layer lies over at least part of the opening in the first insulating layer to form an opening through the first and second insulating layers; a refractory metal layer deposited on the inside surface of the opening through the first and second insulating layers; a copper diffusion barrier layer deposited over the refractory metal layer; an aluminum wetting layer deposited over the copper diffusion barrier layer; and a copper layer deposited over the aluminum wetting layer to fill the opening through the first and second insulating layers, wherein said aluminum wetting layer consists at least in part of a copper aluminum alloy after the copper layer is deposited over the aluminum wetting layer and wherein at least a portion of said silicon substrate lying directly below the refractory metal layer consists at least in part of a refractory metal silicide $MSi_x$ after the refractory metal layer is deposited on the inside surface of the opening through the first and second insulating layers.

In another embodiment there is provided an interconnect on a silicon substrate which comprises a first insulating layer having a conductive metal plug therein; a second insulating layer deposited over the first insulating layer and the conductive metal plug and having an opening overlying the first insulating layer wherein the opening lies over at least part of the conductive metal plug; a copper diffusion barrier layer deposited on the inside surface of the opening; an aluminum wetting layer deposited over the copper diffusion barrier layer; and a copper layer deposited over the aluminum wetting layer to fill the opening, where the aluminum wetting layer consists at least in part of a copper aluminum alloy after the copper layer is deposited over the aluminum wetting layer.

In still another embodiment, there is provided an interconnect on a silicon substrate which comprises a first insulating layer having a conductive metal plug therein; a second insulating layer deposited over the first insulating layer and the conductive metal plug and having an opening overlying the first insulating layer wherein the opening lies over at least part of the conductive metal plug; a $Ti_xAl_yN_z$ barrier layer deposited on the inside surface of the opening; and a copper layer deposited over the $Ti_xAl_yN_z$ barrier layer to fill the opening.

In still another embodiment, there is provided a via level copper/copper dual damascene interconnect on a silicon substrate comprising a first insulating layer having a conductive metal plug therein; a second insulating layer deposited over the first insulating layer and the conductive metal plug and having a first opening overlying the first insulating layer wherein the first opening lies over at least part of the conductive metal plug; a first $Ti_xAl_yN_z$ barrier layer deposited on the inside surface of the first opening; a first copper layer deposited over the first $Ti_xAl_yN_z$ barrier layer to fill the first opening; a third insulating layer deposited over the second insulating layer and the first copper layer and having a second opening overlying the second insulating layer wherein the second opening lies over at least part of the first copper layer; a second $Ti_xAl_yN_z$ barrier layer deposited on the inside surface of the second opening; and a second copper layer deposited over the second $Ti_xAl_yN_z$ barrier layer to fill the second opening.

In still another embodiment, there is provided a via level copper/copper dual damascene interconnect on a silicon substrate comprising a first insulating layer having a conductive metal plug therein; a second insulating layer deposited over the first metal plug layer and the conductive metal plug and having a first opening overlying the first insulating layer wherein the first opening lies over at least part of the conductive metal plug; a copper diffusion barrier layer deposited on the inside surface of the opening; an aluminum wetting layer deposited over the copper diffusion barrier layer; a first copper layer deposited over the aluminum wetting layer to fill the opening; a third insulating layer deposited over the second insulating layer and the first copper layer and having a second opening overlying the second insulating layer wherein the second opening lies over at least part of the first copper layer; a $Ti_xAl_yN_z$ barrier layer deposited on the inside surface of the second opening; and a second copper layer deposited over the $Ti_xAl_yN_z$ barrier layer to fill the second opening, wherein said aluminum wetting layer consists at least in part of a copper aluminum alloy after the first copper layer is deposited over the aluminum wetting layer.

In still another embodiment, there is provided a via level copper/copper dual damascene interconnect on a silicon substrate comprising a first insulating layer having a conductive metal plug therein; a second insulating layer deposited over the first insulating layer and the conductive metal plug and having a first opening overlying the first insulating layer wherein the first opening lies over at least a part of the conductive metal plug; a $Ti_xAl_yN_z$ barrier layer deposited on the inside surface of the first opening; a first copper layer deposited over the $Ti_xAl_yN_z$ barrier layer to fill the first opening; a third insulating layer deposited over the second insulating layer and the first copper layer and having a second opening overlying the second insulating layer wherein the second opening lies over at least part of the first copper layer; a copper diffusion barrier layer deposited on the inside surface of the second opening; an aluminum wetting layer deposited over the copper diffusion barrier layer; and a second copper layer deposited over the aluminum wetting layer to fill the second opening, wherein said aluminum wetting layer consists at least in part of a copper aluminum alloy after the second copper layer is deposited over the aluminum wetting layer.

In still another embodiment, there is provided a via level copper/copper dual damascene interconnect on a silicon substrate comprising a first insulating layer having a conductive metal plug therein; a second insulating layer deposited over the first insulating layer and the conductive metal plug and having a first opening overlying the first insulating layer wherein the first opening lies over at least part of the conductive metal plug; a first copper diffusion barrier layer deposited on the inside surface of the first opening; a first aluminum wetting layer deposited over the first copper diffusion barrier layer; a first copper layer deposited over the first aluminum wetting layer to fill the first opening; a third insulating layer deposited over the second insulating layer and the first copper layer and having a second opening overlying the second insulating layer wherein the second opening lies over at least part of the first copper layer; a second copper diffusion barrier layer on the inside surface of the second opening; a second aluminum wetting layer deposited over the second copper diffusion barrier layer; and a second copper layer deposited over the second aluminum wetting layer to fill the second opening, wherein said first aluminum wetting layer consists at least in part of a first copper aluminum alloy after the first copper layer is deposited over the first aluminum wetting layer and wherein said second aluminum wetting layer consists at least in part of a second copper aluminum alloy after the second copper layer is deposited over the second aluminum wetting layer.

In still another embodiment, there is provided a via level aluminum/copper dual damascene interconnect on a silicon substrate comprising a first insulating layer having a conductive metal plug therein; a second insulating layer deposited over the first insulating layer and the conductive metal plug and having a first opening overlying the first insulating layer wherein the first opening lies over at least part of the conductive metal plug; a wetting layer for aluminum deposited on the inside surface of the first opening; an aluminum layer deposited over the wetting layer for aluminum to fill the first opening; a third insulating layer deposited over the second insulating layer and the aluminum layer and having a second opening overlying the second insulating layer wherein the second opening lies over at least part of the aluminum layer; a copper diffusion barrier layer deposited on the inside surface of the second opening; an aluminum wetting layer deposited over the copper diffusion barrier layer; and a copper layer over the aluminum wetting layer to fill the second opening, wherein said aluminum wetting layer consists at least in part of a copper aluminum alloy after the copper layer is deposited over the aluminum wetting layer.

In still another embodiment, there is provided a via level aluminum/copper dual damascene interconnect on a silicon substrate comprising a first insulating layer having a conductive metal plug therein; a second insulating layer over the first insulating layer and the conductive metal plug and having a first opening overlying the first insulating layer wherein the first opening lies over at least part of the conductive metal plug; an aluminum diffusion barrier layer deposited on the inside surface of the first opening; a wetting layer for aluminum deposited over the aluminum diffusion barrier layer; an aluminum layer deposited over the wetting layer for aluminum to fill the first opening; a third insulating layer deposited over the second insulating layer and the aluminum layer and having a second opening overlying the second insulating layer wherein the second opening lies over at least part of the aluminum layer; a copper diffusion barrier layer deposited on the inside surface of the second opening; a aluminum wetting layer deposited over the copper diffusion barrier layer; and a copper layer deposited over the aluminum wetting layer to fill the second opening, wherein said aluminum wetting layer consists at least in part of a copper aluminum alloy after the copper layer is deposited over the aluminum wetting layer.

In still another embodiment, there is provided a via level aluminum/copper dual damascene interconnect on a silicon substrate comprising a first insulating layer having a conductive metal plug therein; a second insulating layer over the first insulating layer and the conductive metal plug and having a first opening overlying the first insulating layer wherein the first opening lies over at least part of the conductive metal plug; a wetting layer for aluminum deposited on the inside surface of the first opening; an aluminum layer deposited over the wetting layer for aluminum to fill the first opening; a third insulating layer deposited over the second insulating layer and the aluminum layer and having a second opening overlying the second insulating layer wherein the second opening lies over at least part of the aluminum layer; a $Ti_xAl_yN_z$ barrier layer deposited on the inside surface of the second opening; and a copper layer over the $Ti_xAl_yN_z$ layer to fill the second opening.

In still another embodiment, there is provided a via level aluminum/copper dual damascene interconnect on a silicon substrate comprising a first insulating layer having a conductive metal plug therein; a second insulating layer deposited over the first insulating layer and the conductive metal plug and having a first opening overlying the first insulating layer wherein the first opening lies over at least part of the conductive metal plug; an aluminum diffusion barrier layer deposited on the inside surface of the first opening; a wetting layer for aluminum deposited over the aluminum diffusion barrier layer; an aluminum layer deposited over the wetting layer for aluminum to fill the opening; a third insulating layer deposited over the second insulating layer and the aluminum layer and having a second opening overlying the second insulating layer wherein the second opening lies over at least part of the aluminum layer; a $Ti_xAl_yN_z$ barrier layer deposited on the inside surface of the second opening; and a copper layer deposited over the $Ti_xAl_yN_z$ barrier layer to fill the second opening.

In yet still another embodiment, there is provided a semiconductor device which comprises a silicon substrate; a first insulating layer on said silicon substrate having a conductive metal plug therein; a second insulating layer deposited over the first insulating layer and the conductive metal plug and having an opening overlying the first insulating layer wherein the opening lies over at least part of the conductive metal plug; a copper diffusion barrier layer deposited on the inside surface of the opening; an aluminum wetting layer deposited over the copper diffusion barrier layer; and a copper layer deposited over the aluminum wetting layer to fill the opening, where the aluminum wetting layer consists at least in part of a copper aluminum alloy after the copper layer is deposited over the aluminum wetting layer.

And in still another embodiment, there is provided a semiconductor device which comprises a silicon substrate; a first insulating layer on said silicon substrate having a conductive metal plug therein; a second insulating layer deposited over the first insulating layer and the conductive metal plug and having an opening overlying the first insulating layer wherein the opening lies over at least part of the conductive metal plug; a $Ti_xAl_yN_z$ barrier layer deposited on the inside surface of the opening; and a copper layer deposited over the $Ti_xAl_yN_z$ barrier layer to fill the opening.

And in yet another embodiment, there is provided a semiconductor device comprising a silicon substrate; a first insulating layer on said silicon substrate having a conductive metal plug therein; a second insulating layer deposited over the first insulating layer and the conductive metal plug and having a first opening overlying the first insulating layer wherein the first opening lies over at least part of the conductive metal plug; a first $Ti_xAl_yN_z$ barrier layer deposited on the inside surface of the first opening; a first copper layer deposited over the first $Ti_xAl_yN_z$ barrier layer to fill the first opening; a third insulating layer deposited over the second insulating layer and the first copper layer and having a second opening overlying the second insulating layer wherein the second opening lies over at least part of the first copper layer; a second $Ti_xAl_yN_z$ barrier layer deposited on the inside surface of the second opening; and a second copper layer deposited over the second $Ti_xAl_yN_z$ barrier layer to fill the second opening.

And in yet another embodiment, there is provided a semiconductor device comprising a silicon substrate; a first insulating layer on said silicon substrate having a conductive metal plug therein; a second insulating layer deposited over the first insulating layer and the conductive metal plug and having a first opening overlying the first insulating layer wherein the first opening lies over at least part of the conductive metal plug; a copper diffusion barrier layer deposited on the inside surface of the opening; an aluminum wetting layer deposited over the copper diffusion barrier layer; a first copper layer deposited over the aluminum wetting layer to fill the opening; a third insulating layer deposited over the second insulating layer and the first copper layer and having a second opening overlying the second insulating layer wherein the second opening lies over at least part of the first copper layer; a $Ti_xAl_yN_z$ barrier layer deposited on the inside surface of the second opening; and a second copper layer deposited over the $Ti_xAl_yN_z$ barrier layer to fill the second opening, wherein said aluminum wetting layer consists at least in part of a copper aluminum alloy after the first copper layer is deposited over the aluminum wetting layer.

And in yet another embodiment, there is provided a semiconductor device comprising a silicon substrate; a first insulating layer on said silicon substrate having a conductive metal plug therein; a second insulating layer deposited over the first insulating layer and the conductive metal plug and having a first opening overlying the first insulating layer wherein the first opening lies over at least a part of the conductive metal plug; a $Ti_xAl_yN_z$ barrier layer deposited on the inside surface of the first opening; a first copper layer deposited over the $Ti_xAl_yN_z$ barrier layer to fill the first opening; a third insulating layer deposited over the second insulating layer and the first copper layer and having a second opening overlying the second insulating layer wherein the second opening lies over at least part of the first copper layer; a copper diffusion barrier layer deposited on the inside surface of the second opening; an aluminum wetting layer deposited over the copper diffusion barrier layer; and a second copper layer deposited over the aluminum wetting layer to fill the second opening, wherein said aluminum wetting layer consists at least in part of a copper aluminum alloy after the second copper layer is deposited over the aluminum wetting layer.

And in yet another embodiment, there is provided a semiconductor device comprising a silicon substrate; a first insulating layer on said silicon substrate having a conductive metal plug therein; a second insulating layer deposited over the first insulating layer and the conductive metal plug and having a first opening overlying the first insulating layer wherein the first opening lies over at least part of the conductive metal plug; a first copper diffusion barrier layer deposited on the inside surface of the first opening; a first aluminum wetting layer deposited over the first copper diffusion barrier layer; a first copper layer deposited over the first aluminum wetting layer to fill the first opening; a third insulating layer deposited over the second insulating layer and the first copper layer and having a second opening overlying the second insulating layer wherein the second opening lies over at least part of the first copper layer; a second copper diffusion barrier layer on the inside surface of the second opening; a second aluminum wetting layer deposited over the second copper diffusion barrier layer; and a second copper layer deposited over the second aluminum wetting layer to fill the second opening, wherein said first aluminum wetting layer consists at least in part of a first copper aluminum alloy after the first copper layer is deposited over the first aluminum wetting layer and wherein said second aluminum wetting layer consists at least in part of a second copper aluminum alloy after the second copper layer is deposited over the second aluminum wetting layer.

And in yet another embodiment, there is provided a semiconductor device comprising a silicon substrate; a first insulating layer on said silicon substrate having a conductive metal plug therein; a second insulating layer deposited over the first insulating layer and the conductive metal plug and having a first opening overlying the first insulating layer wherein the first opening lies over at least part of the conductive metal plug; a wetting layer for aluminum deposited on the inside surface of the first opening; an aluminum layer deposited over the wetting layer for aluminum to fill the first opening; a third insulating layer deposited over the second insulating layer and the aluminum layer and having a second opening overlying the second insulating layer wherein the second opening lies over at least part of the aluminum layer; a copper diffusion barrier layer deposited on the inside surface of the second opening; an aluminum wetting layer deposited over the copper diffusion barrier layer; and a copper layer deposited over the aluminum wetting layer to fill the second opening, wherein said aluminum wetting layer consists at least in part of a copper aluminum alloy after the copper layer is deposited over the aluminum wetting layer.

And in yet another embodiment, there is provided a semiconductor device comprising a silicon substrate; a first insulating layer on said silicon substrate having a conductive metal plug therein; a second insulating layer over the first insulating layer and the conductive metal plug and having a first opening overlying the first insulating layer wherein the first opening lies over at least part of the conductive metal plug; an aluminum diffusion barrier layer deposited on the inside surface of the first opening; a wetting layer for aluminum deposited over the aluminum diffusion barrier layer; a aluminum layer deposited over the wetting layer for aluminum to fill the first opening; a third insulating layer deposited over the second insulating layer and the aluminum layer and having a second opening overlying the second insulating layer wherein the second opening lies over at least part of the aluminum layer; a copper diffusion barrier layer deposited on the inside surface of the second opening; an aluminum wetting layer deposited over the copper diffusion barrier layer; and a copper layer deposited over the aluminum wetting layer to fill the second opening, wherein said aluminum wetting layer consists at least in part of a copper aluminum alloy after the copper layer is deposited over the aluminum wetting layer.

And in yet another embodiment, there is provided a semiconductor device comprising a silicon substrate; a first insulating layer on said silicon substrate having a conductive metal plug therein; a second insulating layer over the first insulating layer and the conductive metal plug and having a first opening overlying the first insulating layer wherein the first opening lies over at least part of the conductive metal plug; a wetting layer for aluminum deposited on the inside surface of the first opening; an aluminum layer deposited over the wetting layer for aluminum to fill the first opening; a third insulating layer deposited over the second insulating layer and the aluminum layer and having a second opening overlying the second insulating layer wherein the second opening lies over at least part of the aluminum layer; a $Ti_xAl_yN_z$ barrier layer deposited on the inside surface of the second opening; and a copper layer over the $Ti_xAl_yN_z$ barrier layer to fill the second opening.

And in yet another embodiment, there is provided a semiconductor device comprising a silicon substrate; a first insulating layer on said silicon substrate having a conductive metal plug therein; a second insulating layer deposited over the first insulating layer and the conductive metal plug and having a first opening overlying the first insulating layer wherein the first opening lies over at least part of the conductive metal plug; an aluminum diffusion barrier layer deposited on the inside surface of the first opening; a wetting layer for aluminum deposited over the aluminum diffusion barrier layer; an aluminum layer deposited over the wetting layer for aluminum to fill the opening; a third insulating layer deposited over the second insulating layer and the aluminum layer and having a second opening overlying the second insulating layer wherein the second opening lies over at least part of the aluminum layer; a $Ti_xAl_yN_z$ barrier layer deposited on the inside surface of the second opening; and a copper layer deposited over the $Ti_xAl_yN_z$ barrier layer to fill the second opening.

DETAILED DESCRIPTION OF THE INVENTION

The present invention provides generally for improved methods for filling openings in silicon substrates with copper. One method involves the use of a $Ti_xAl_yN_z$ barrier layer which is stable to the high temperatures required to reflow copper after PVD deposition. Another method involves the use of an aluminum wetting layer between a barrier layer and the copper which effectively lowers the temperature at which copper reflows and therefore allows the use of typical barrier layers.

As used herein, the term "opening" refers to vias, trenches, grooves, contact holes, and the like in silicon substrates. Also, according to the present invention, the term "silicon substrate" refers to silicon structures, including silicon wafers, silicon structures in the process of fabrication, any layer on a silicon substrate which is in the process of fabrication, a semiconductor layer, including a semiconductor layer in the process of fabrication, and the like. The term "silicon wafer" means either the lowest layer of a semiconductor material in a wafer or a wafer having additional layers or structures formed thereon. The term "fabrication" means the process of forming patterns on a silicon structure or semiconductor structure through photolithography.

Figure 1:
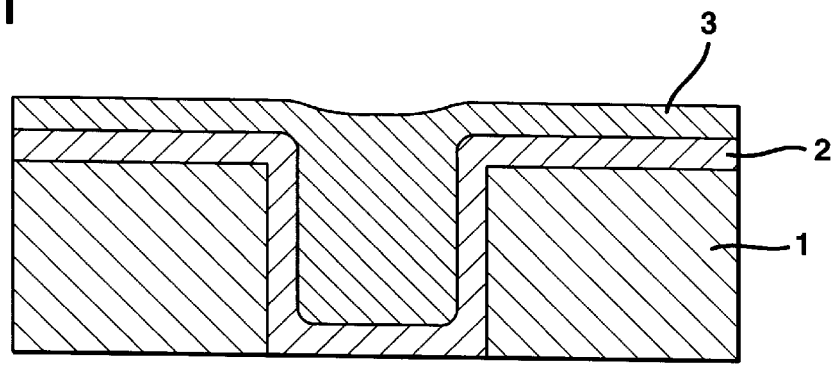
FIG. 1 depicts a cross-section of an insulating layer of a silicon substrate having an opening overlaid with a $Ti_xAl_yN_z$ barrier layer and then filled with copper.

FIG. 1 shows a cross-section of an insulating layer 1 of a silicon substrate having an opening which is overlaid with a $Ti_xAl_yN_z$ barrier layer 2 and then filled with copper 3. In the formula $Ti_xAl_yN_z$, each of x, y, and z is an integer such that each of Ti, Al, and N constitutes greater than 10% of the total atomic composition, wherein a composition with approximately 35–45% titanium, 5–15% aluminum, and 45–55% nitrogen is preferred, and a composition with 40% titanium, 10% aluminum, and 50% nitrogen is especially preferred. The $Ti_xAl_yN_z$ barrier layer 2 is deposited by target sputtering (PVD) TiAl in a nitrogen atmosphere. The TiAl has an atomic composition of approximately 75–85% titanium and 15–25% aluminum, with 80% titanium and 20% aluminum being preferred. The $Ti_xAl_yN_z$ barrier layer 2 is deposited to a thickness of approximately 200 Å to approximately 500 Å. Copper 3 is then deposited over the $Ti_xAl_yN_z$ barrier layer 2 by PVD sputter to fill the opening. Alternatively, copper 3 may be deposited by CVD, electroplating or electroless plating techniques. In order to increase the diffusion barrier capabilities of the $Ti_xAl_yN_z$ barrier layer 2, the $Ti_xAl_yN_z$ barrier layer 2 may optionally be annealed in an oxygen atmosphere by subjecting the silicon substrate so formed to rapid thermal processing (RTP) while flowing in oxygen at a temperature of less then 700° C. for less than 5 minutes prior to the deposition of copper 3, thereby doping the $Ti_xAl_yN_z$ barrier layer 2 with oxygen or an oxygen species $O_m$ wherein m is greater than or equal to 1. Copper 3 is then hot deposited at a temperature of approximately 450° C. to approximately 550° C. by a PVD sputter to a thickness which is sufficient to fill the opening. The copper layer is then annealed by subjecting the silicon substrate so formed to an elevated temperature in a vacuum for a period of time less than 5 minutes. Alternatively, the anneal may be carried out by flowing in gases, such as hydrogen. After annealing, the copper is then caused to reflow at a temperature greater than about 500° C. by techniques well known to one of ordinary skill in the art.

Figure 2:
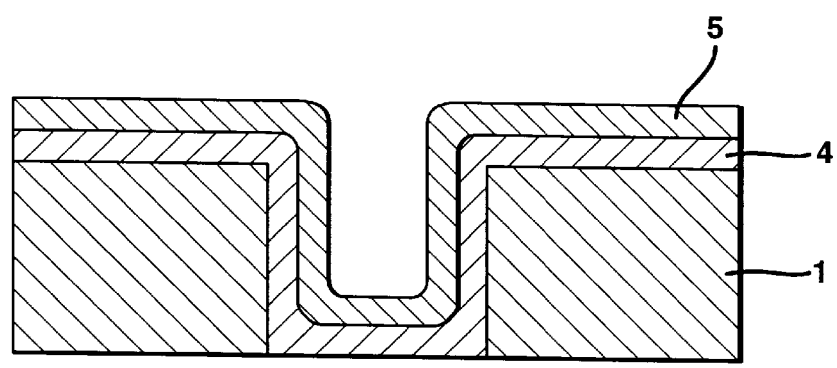
FIG. 2 depicts a cross-section of an insulating layer of a silicon substrate having an opening overlaid with a copper diffusion barrier layer which is in turn overlaid with an aluminum wetting layer prior to filling with copper.

FIG. 2 shows a cross-section of an insulating layer 1 of a silicon substrate having an opening which is overlaid with a copper diffusion barrier layer 4 which is then overlaid with aluminum wetting layer 5. The copper diffusion barrier layer 4 may be any metal nitride and includes tantalum nitride (TaN), titanium nitride (TiN), tungsten nitride (WN) and a titanium aluminum nitride ($Ti_xAl_yN_z$) having the atomic composition described above in the description of FIG. 1 being preferred. The copper diffusion barrier layer 4 is deposited by PVD or CVD techniques well known to one of ordinary skill in the art and is deposited to a thickness of approximately 100 Å to approximately 2000 Å. Aluminum wetting layer 5 is then deposited over the copper diffusion barrier layer 4. The aluminum wetting layer 5 is deposited using PVD or CVD techniques well known to one of ordinary skill in the art and is deposited to a thickness of approximately 50 Å to approximately 500 Å, with approximately 200 Å being preferred.

Figure 3:
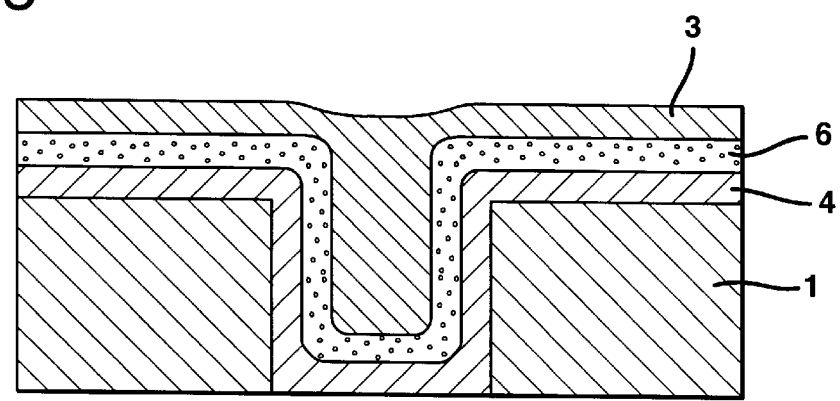
FIG. 3 depicts a cross-section of an insulating layer in a silicon substrate having an opening overlaid with a copper diffusion barrier layer which is in turn overlaid with an aluminum wetting layer and then filled with copper, showing the formation of a $Cu_nAl$ alloy.

FIG. 3 shows a cross-section of an insulating layer 1 of a silicon substrate having an opening which is overlaid with a copper diffusion barrier layer 4 which, after being overlaid with an aluminum wetting layer 5 (not shown), is then filled with copper 3, annealed, and caused to reflow as described above in the description of FIG. 1. Upon filling with copper, annealing and reflow, the aluminum wetting layer 5 is consumed thereby forming a $Cu_nAl$ alloy layer 6 wherein n is an integer from about 0.5 to about 4. The $Cu_nAl$ alloy layer 6 has a lower melting point (i.e., 450° C.) than elemental copper (i.e., 1000° C.), thus making it easier for the copper to flow into the opening. Although depicted as a total consumption of the aluminum wetting layer 5, it is to be understood that total consumption of aluminum wetting layer 5 may not occur upon the deposition of copper 3, annealing and reflow steps, and that some aluminum which is not in the form of a $Cu_nAl$ alloy may be present in the layer which is depicted as the $Cu_nAl$ alloy layer 6.

Figure 4:
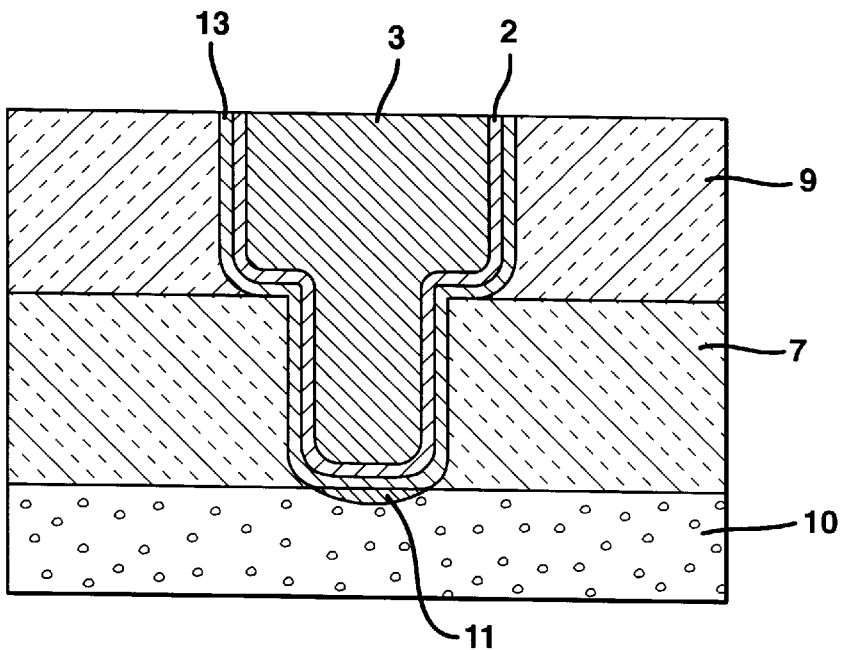
FIG. 4 depicts a cross-section of a contact level dual damascene having a silicon substrate having a first insulating layer having an opening and a second insulating layer overlying the first insulating layer and having an opening, where the opening in the second insulating layer lies over at least a part of the opening in the first insulating layer thereby forming an opening through the first and second insulating layers and where the opening is overlaid with refractory metal layer which is in turn overlaid with a $Ti_xAl_yN_z$ barrier layer and then filled with copper, showing the formation of a $MSi_x$ alloy.

FIG. 4 shows a cross-section of a contact level dual damascene having a silicon substrate 10 having a first insulating layer 7 having an opening and a second insulating layer 9 having an opening, wherein the opening in the second insulating layer 9 lies over at least a part of the opening in the first insulating layer 7 thereby forming an opening through the first and second insulating layers and where the opening is overlaid with a refractory metal layer 13 which is in turn overlayed with a $Ti_xAl_yN_z$ barrier layer 2, the $Ti_xAl_yN_z$ barrier layer 2 optionally doped with oxygen or an oxygen species $O_m$ wherein m is as previously defined, and then filled with copper 3, annealed, and caused to reflow as described above in the description of FIG. 1. Upon overlaying the opening with a refractory metal layer 13, at least a portion of the silicon substrate 10 lying directly below the refractory metal 13 consists at least in part of a refractory metal silicide $MSi_x$ 11, wherein x is an integer from about 0.5 to about 4. The refractory metal silicide $MSi_x$ 11 provides for a low resistance contact between the interconnect and the silicon substrate 10. The refractory metal layer 13 may be any refractory metal and includes Ti, Ta, W, Co, Ni and TiAl. The refractory metal layer 13 is deposited by PVD or CVD techniques as are well known to one of ordinary skill in the art, PVD deposition being preferred, and is deposited to a thickness of approximately 100 Å to approximately 800 Å, with approximately 300 Å being preferred. The fabrication of a contact level dual damascene as shown in FIG. 4 may be accomplished by using patterning, deposition and planarization techniques and using materials well known to one of ordinary skill in the art. For example, a suitable first insulating layer 7 is borophosphorous silicate glass and a suitable second insulating layer 9 is silicon oxide which may be deposited from tetraethyl orthosilicate with plasma-assistance (PETEOS).

Figure 5:
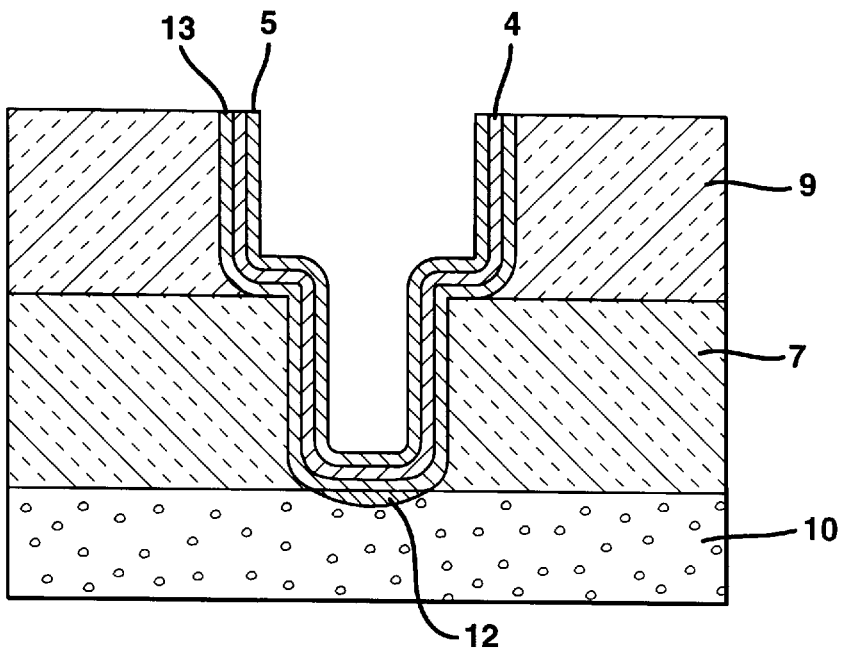
FIG. 5 depicts a cross-section of a contact level dual damascene having a silicon substrate having a first insulating layer having an opening and a second insulating layer overlying the first insulating layer and having an opening, where the opening in the second insulating layer lies over at least a part of the opening in the first insulating layer thereby forming an opening through the first and second insulating layers and where the opening is overlaid with refractory metal layer which is in turn overlaid with a copper diffusion barrier layer, which is in turn overlaid with an aluminum wetting layer, showing the formation of a $MSi_x$ alloy.

FIG. 5 shows a cross-section of a contact level dual damascene prior to filling with copper, having a silicon substrate 10 having a first insulating layer 7 having an opening and a second insulating layer 9 having an opening, wherein the opening in the second insulating layer 9 lies over at least a part of the opening in the first insulating layer 7 thereby forming an opening through the first and second insulating layers and where the opening is overlaid with a refractory metal layer 13 which is in turn overlaid with a copper diffusion barrier layer 4 which is in turn overlaid with an aluminum wetting layer 5. Upon overlaying the openings with a refractory metal layer 13 as described in FIG. 4, at least a portion of the silicon substrate 10 lying directly below the refractory metal 13 consists at least in part of a refractory metal silicide $MSi_x$ 11 as described in FIG. 4. The fabrication of a contact level dual damascene as shown in FIG. 5 may be as described in FIG. 4.

Figure 6:
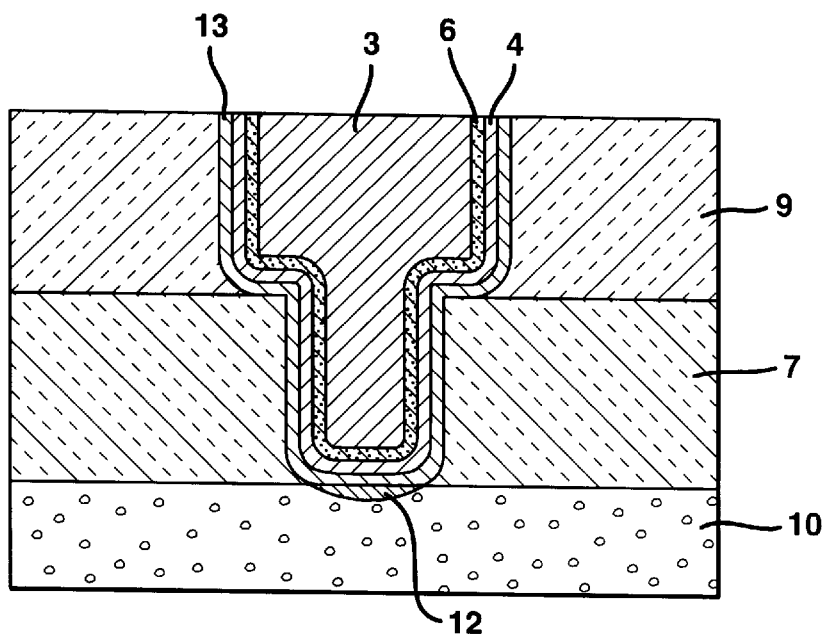
FIG. 6 depicts a cross-section of a contact level dual damascene having a first insulating layer having an opening and a second insulating layer overlying the first insulating layer and having an opening, where the opening in the second insulating layer lies over at least a part of the opening in the first insulating layer, thereby forming an opening through the first and second insulating layers and where the opening is overlaid with refractory metal layer which is in turn overlaid with a copper diffusion barrier layer which is in turn overlaid with an aluminum wetting layer and then filled with copper, showing the formation of a $Cu_nAl$ alloy and the formation of a $MSi_x$ alloy.

FIG. 6 shows a cross-section of a contact level dual damascene having a silicon substrate 10 having a first insulating layer 7 having an opening and a second insulating layer 9 having an opening, wherein the opening in the second insulating layer 9 lies over at least a part of the opening in the first insulating layer 7 thereby forming an opening through the first and second insulating layers, and where the opening is overlaid with a refractory metal layer 13 which is in turn overlaid with a copper diffusion barrier layer 4 which, after being overlaid with an aluminum wetting layer 5 (not shown), is then filled with copper 3, annealed, and caused to reflow as described above in the description of FIG. 1. Upon filling with copper, annealing and reflow, the aluminum wetting layer 5 is consumed thereby forming a $Cu_nAl$ alloy layer 6 as described previously in FIG. 3. In addition, upon overlaying the opening with a refractory metal layer 13 as described in FIG. 4, at least a portion of the silicon substrate 10 lying directly below the refractory metal 13 consists at least in part of a refractory metal silicide $MSi_x$ 11 as described in FIG. 4. The fabrication of a contact level dual damascene as shown in FIG. 6 may be accomplished as described in FIG. 4.

Figure 7:
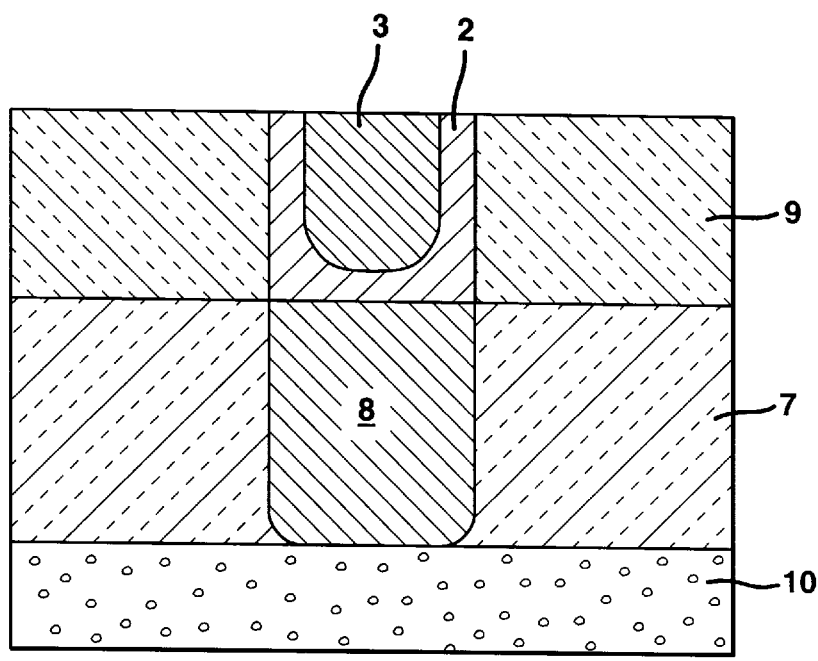
FIG. 7 depicts a cross-section of an interconnect having a first insulating layer containing a conductive metal plug and a second insulating layer having an opening overlying the first insulating layer where the opening lies over at least a part of the conductive metal plug and where the opening is overlaid with a $Ti_xAl_yN_z$ barrier layer and then filled with copper.

FIG. 7 shows a cross-section of an interconnect of the present invention having a first insulating layer 7 containing a conductive metal plug 8 and a second insulating layer 9 having an opening overlying the first insulating layer 7 where the opening lies over at least a part of the conductive metal plug 8 and where the opening is overlaid with a $Ti_xAl_yN_z$ barrier layer 2, the $Ti_xAl_yN_z$ barrier layer 2 optionally doped with oxygen as described previously in FIG. 1, and then filled with copper 3, annealed, and caused to reflow as is described above in the description of FIG. 1. The fabrication of silicon substrate to form an interconnect as shown in FIG. 7 may be accomplished by using depositing, patterning, and planarization techniques and using materials well known to one of ordinary skill in the art. For example, a suitable first insulating layer 7 is borophosphorous silicate glass and a suitable second insulating layer 9 is silicon oxide which may be deposited from tetraethyl orthosilicate (TEOS). An example of a conductive metal plug 8 is a tungsten plug. The interconnect as formed above is then subjected to chemical mechanical planarization processes well known in the art to planarize and isolate the interconnect.

Figure 8:
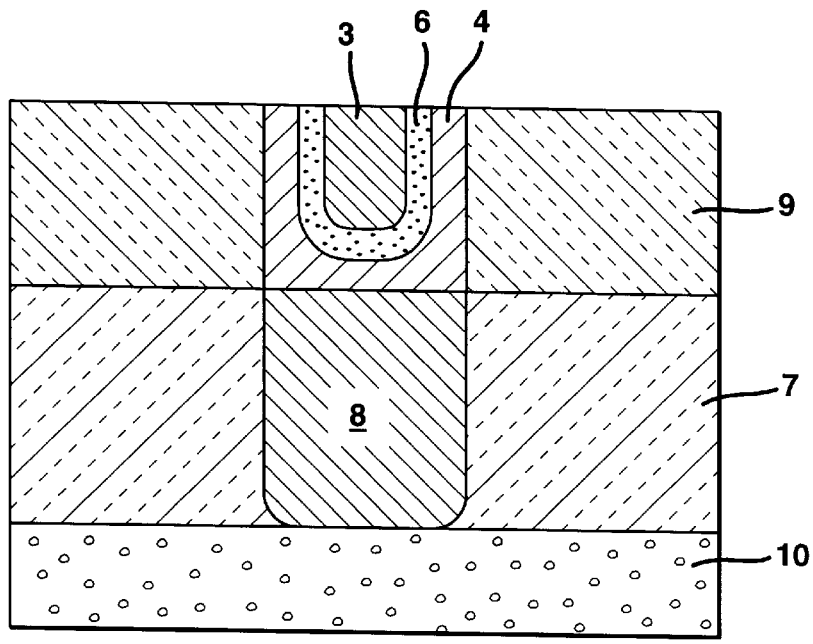
FIG. 8 depicts a cross-section of an interconnect having a first insulating layer containing a conductive metal plug and a second insulating layer having an opening overlying the first insulating layer where the opening lies over at least a part of the conductive metal plug and where the opening is first overlaid with a copper diffusion barrier layer and which is in turn overlaid with an aluminum wetting layer and then filled with copper, showing the formation of a $Cu_nAl$ alloy.

FIG. 8 depicts a cross-section of an interconnect having a first insulating layer 7 containing a conductive metal plug 8 and a second insulating layer 9 having an opening overlying the first insulating layer 7 where the opening lies over at least a part of the conductive metal plug 8 and where the opening is first overlaid with a copper diffusion barrier layer 4 and which is in turn overlaid with an aluminum wetting layer (not shown) and then filled with copper, annealed, and caused to reflow as described above in the embodiments depicted in FIG. 2 and FIG. 3, showing the formation of a $Cu_nAl$ alloy 6 as is described in the embodiment depicted in FIG. 3. The fabrication of silicon substrate to form an interconnect as shown in FIG. 8 may be accomplished by using depositing, patterning, and planarization techniques and using materials well known to one of ordinary skill in the art and as described above in the embodiments depicted in FIG. 7.

Figure 9:
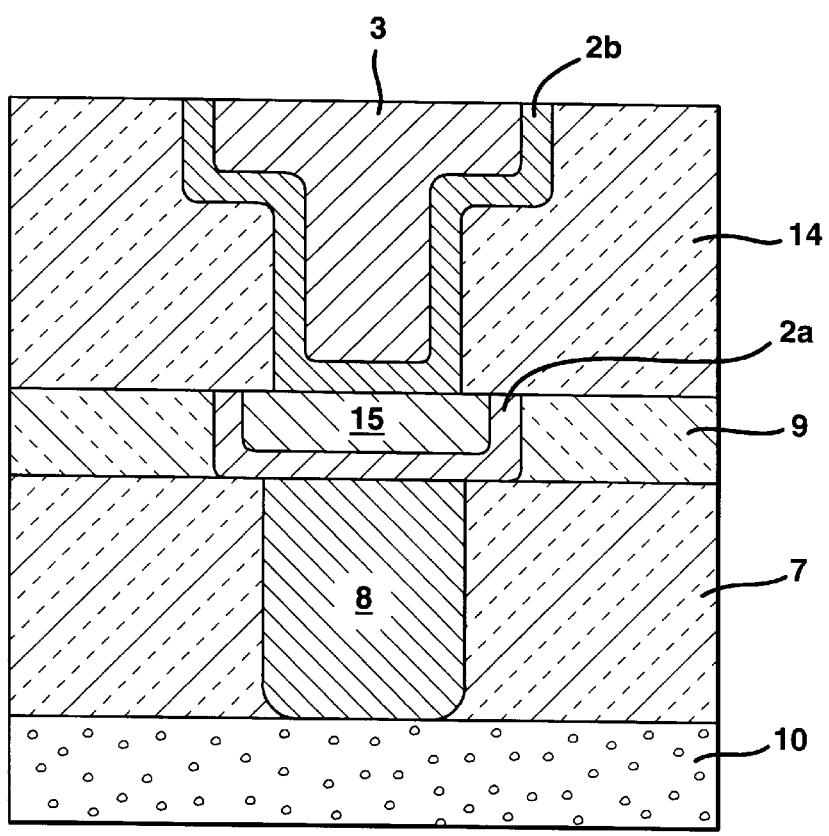
FIG. 9 depicts a cross-section of an via level copper/copper dual damascene interconnect having a first insulating layer containing a conductive metal plug, a second insulating layer overlying the first insulating layer and having a first opening, where the first opening lies over at least a part of the conductive metal plug and where the opening is overlaid with a first $Ti_xAl_yN_z$ barrier layer and then filled with a first copper layer, and a third insulating layer overlying the second insulating layer and having a second opening, where the second opening lies over at least a part of the first copper layer and where the second opening is overlaid with a second $Ti_xAl_yN_z$ barrier layer and then filled with a second copper layer.

FIG. 9 shows a cross-section of a via level copper/copper dual damascene interconnect of the present invention having a first insulating layer 7 containing a conductive metal plug 8, a second insulating layer 9 having a first opening overlying the first insulating layer 7 where the first opening lies over at least a part of the conductive metal plug 8 and where the first opening is overlaid with a first $Ti_xAl_yN_z$ barrier layer 2, the first $Ti_xAl_yN_z$ barrier layer 2 optionally doped with oxygen as described previously in FIG. 1, and then filled with copper 15 as described above in the description of FIG. 1 but without the annealing and reflow steps, and a third insulating layer 14 having a second opening overlying the second insulating layer 9 where the second opening lies over at least a part of the copper 15 and where the second opening is overlaid with a second $Ti_xAl_yN_z$ barrier layer 2b, the second $Ti_xAl_yN_z$ barrier layer 2b being optionally doped with oxygen as described previously in FIG. 1, and then filled with copper 3, annealed, and caused to reflow as described above in the description of FIG. 1. After deposition of the copper layer 15, the silicon wafer is subjected to chemical mechanical planarization (CMP) techniques as are well known to one of ordinary skill in the art prior to further fabrication. The fabrication of silicon substrate to form a via level copper/copper dual damascene interconnect as shown in FIG. 9 may be accomplished by using depositing, patterning, and planarization techniques and using materials well known to one of ordinary skill in the art. For example, a suitable first insulating layer 7 is borophosphorous silicate glass, a suitable second insulating layer 9 is silicon oxide which may be deposited from tetraethyl orthosilicate (TEOS), deposited to a thickness of approximately 1000 Å to approximately 1.5 μm, and a suitable third insulating layer 14 is silicon oxide which may be deposited from tetraethyl orthosilicate (TEOS), deposited to a thickness of approximately 400 Å to approximately 2 μm.

Figure 10:
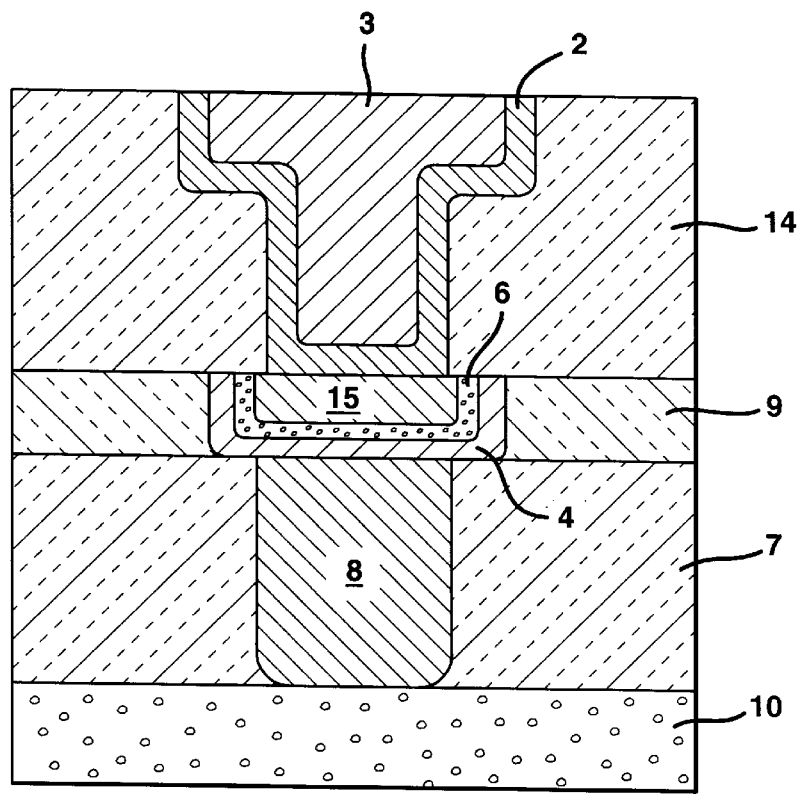
FIG. 10 depicts a cross-section of a via level copper/copper dual damascene interconnect having a first insulating layer containing a conductive metal plug, a second insulating layer overlying the first insulating layer and having a first opening, where the first opening lies over at least a part of the conductive metal plug and where the first opening is overlaid with a copper diffusion barrier layer and which is in turn overlaid with an aluminum wetting layer and then filled with a first copper layer, showing the formation of a $Cu_nAl$ alloy, and a third insulating layer overlying the second insulating layer and having a second opening, where the second opening lies over at least a part of the first copper layer and where the second opening is overlaid with a $Ti_xAl_yN_z$ barrier layer and then filled with a second copper layer.

FIG. 10 shows a cross-section of a via level copper/copper dual damascene interconnect of the present invention having a first insulating layer 7 containing a conductive metal plug 8, a second insulating layer 9 having a first opening overlying the first insulating layer 7 where the first opening lies over at least a part of the conductive metal plug 8 and where the first opening is overlaid with a copper diffusion barrier layer 4 and which is in turn overlaid with an aluminum wetting layer (not shown) and then filled with copper 15 as described above in the embodiments depicted in FIG. 3 but without the annealing and reflow steps, showing the formation of a $Cu_nAl$ alloy 6 as is described in the embodiment depicted in FIG. 3, and then filled with copper 15, annealed, and caused to reflow as described above in the description of FIG. 1, and a third insulating layer 14 having a second opening overlying the second insulating layer 9 where the second opening lies over at least a part of the copper 15 and where the second opening is overlaid with a $Ti_xAl_yN_z$ barrier layer 2, the $Ti_xAl_yN_z$ barrier layer 2 optionally doped with oxygen as described previously in FIG. 1, and then filled with copper 3, annealed, and caused to reflow as described above in the description of FIG. 1. The fabrication of silicon substrate to form a via level copper/copper dual damascene interconnect as shown in FIG. 10 may be accomplished using depositing, patterning, and planarization techniques and using material well known to one of ordinary skill in the art and as described above in FIG. 9.

Figure 11:
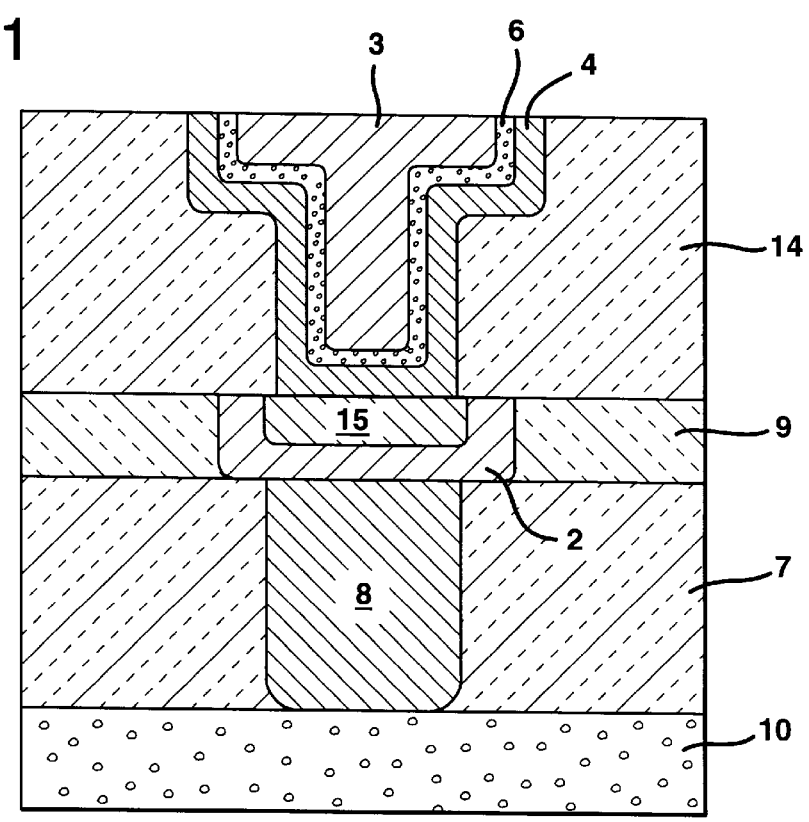
FIG. 11 depicts a cross-section of a via level copper/copper dual damascene interconnect having a first insulating layer containing a conductive metal plug, a second insulating layer overlying the first insulating layer and having a first opening, where the first opening lies over at least a part of the conductive metal plug and where the first opening is overlaid with a $Ti_xAl_yN_z$ barrier layer and then filled with a first copper layer, and a third insulating layer overlying the second insulating layer and having a second opening, where the second opening lies over at least a part of the first copper layer and where the second opening is overlaid with a copper diffusion barrier layer and which is in turn overlaid with an aluminum wetting layer and then filled with a second copper layer, showing the formation of a $Cu_nAl$ alloy.

FIG. 11 shows a cross-section of a via level copper/copper dual damascene interconnect of the present invention having a first insulating layer 7 containing a conductive metal plug 8, a second insulating layer 9 having a first opening overlying the first insulating layer 7 where the first opening lies over at least a part of the conductive metal plug 8 and where the first opening is overlaid with a $Ti_xAl_yN_z$ barrier layer 2, the $Ti_xAl_yN_z$ barrier layer 2 optionally doped with oxygen as described previously in FIG. 1, and then filled with copper 15 as described above in the description of FIG. 1 but without the annealing and reflow steps, and a third insulating layer 14 having a second opening overlying the second insulating layer 9 where the second opening lies over at least a part of the copper 15 and where the second opening is overlaid with a copper diffusion barrier layer 4 and which is in turn overlaid with an aluminum wetting layer (not shown) and then filled with copper 3, annealed, and caused to reflow as described above in the embodiments depicted in FIG. 1, showing the formation of a $Cu_nAl$ alloy 6 as is described in the embodiment depicted in FIG. 3. The fabrication of silicon substrate to form a via level copper/copper dual damascene interconnect as shown in FIG. 11 may be accomplished by using depositing, patterning, and planarization techniques and using materials well known to one of ordinary skill in the art and as described above in the embodiments depicted in FIG. 9.

Figure 12:
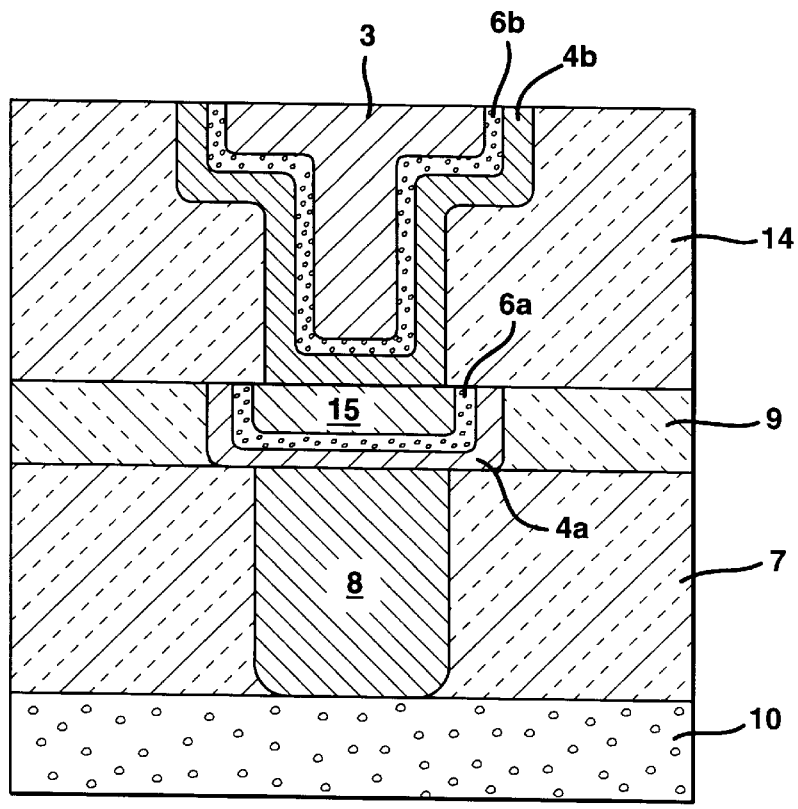
FIG. 12 depicts a cross-section of a via level copper/copper dual damascene interconnect having a first insulating layer containing a conductive metal plug, a second insulating layer overlying the first insulating layer and having a first opening, where the first opening lies over at least a part of the conductive metal plug and where the first opening is overlaid with a first copper diffusion barrier layer and which is in turn overlaid with a first aluminum wetting and then filled with a first copper layer, showing the formation a first $Cu_nAl$ alloy, and a third insulating layer overlying the second insulating layer and having a second opening, where the second opening lies over at least a part of the first copper layer and where the second opening is overlaid with a second copper diffusion barrier layer and which is in turn overlaid with a second aluminum wetting layer and then filled with a second copper layer, showing the formation a second $Cu_nAl$ alloy.

FIG. 12 shows a cross-section of a via level copper/copper dual damascene interconnect of the present invention having a first insulating layer 7 containing a conductive metal plug 8, a second insulating layer 9 having a first opening overlying the first insulating layer 7 where the first opening lies over at least a part of the conductive metal plug 8 and where the first opening is overlaid with a first copper diffusion barrier layer 4a and which is in turn overlaid with an first aluminum wetting layer (not shown) and then filled with copper 15 as described above in the embodiments depicted in FIG. 2 but without the annealing and reflow steps, showing the formation of a first $Cu_nAl$ alloy 6a as is described in the embodiment depicted in FIG. 3, and a third insulating layer 14 having a second opening overlying the second insulating layer 9 where the second opening lies over at least a part of the copper 15 and where the second opening is overlaid with a second copper diffusion barrier layer 4b and which is in turn overlaid with a second aluminum wetting layer (not shown) and then filled with copper 3, annealed, and caused to reflow as described above in the embodiments depicted in FIG. 1, showing the formation of a second $Cu_nAl$ alloy 6b as is described in the embodiment depicted in FIG. 3. The fabrication of silicon substrate to form a via level copper/copper dual damascene interconnect as shown in FIG. 12 may be accomplished by using depositing, patterning, and planarization techniques and using materials well known to one of ordinary skill in the art and as described above in the embodiments depicted in FIG. 9.

Figure 13:
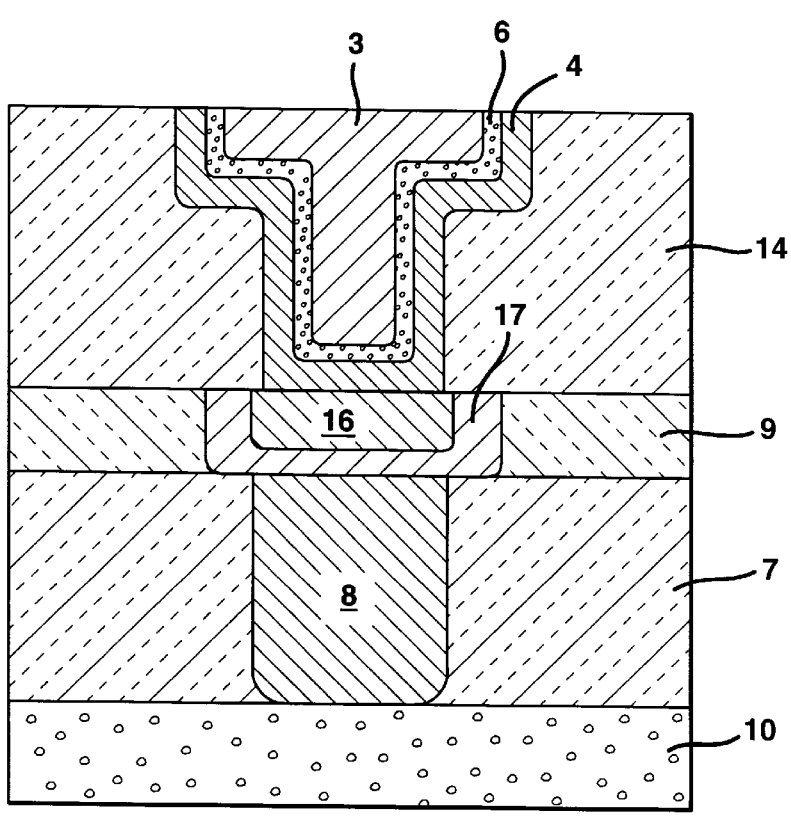
FIG. 13 depicts a cross-section of a via level aluminum/copper dual damascene interconnect having a first insulating layer containing a conductive metal plug, a second insulating layer overlying the first insulating layer and having a first opening, where the first opening lies over at least a part of the conductive metal plug and where the first opening is overlaid with a wetting layer for aluminum and then filled with an aluminum layer, and a third insulating layer overlying the second insulating layer and having a second opening, where the second opening lies over at least a part of the aluminum layer and where the second opening is overlaid with a copper diffusion barrier layer and which is in turn overlaid with an aluminum wetting layer and then filled with copper, showing the formation of a $Cu_nAl$ alloy.

FIG. 13 shows a cross-section of a via level aluminum/copper dual damascene interconnect of the present invention having a first insulating layer 7 containing a conductive metal plug 8, a second insulating layer 9 having a first opening overlying the first insulating layer 7 where the first opening lies over at least a part of the conductive metal plug 8 and where the first opening is overlaid with a wetting layer for aluminum 17 and then filled with aluminum 16, and a third insulating layer 14 having a second opening overlying the second insulating layer 9 where the second opening lies over at least a part of the aluminum 16 and where the second opening is overlaid with a copper diffusion barrier layer 4 and which is in turn overlaid with an aluminum wetting layer (not shown) and then filled with copper 3, annealed, and caused to reflow as described above in the embodiments depicted in FIG. 1, showing the formation of a $Cu_nAl$ alloy 6 as is described in the embodiment depicted in FIG. 3. The wetting layer for aluminum 17 is selected from the group consisting of titanium and titanium nitride and is deposited by PVD techniques well known to one of ordinary skill in the art to a thickness of approximately 100 Å to approximately 800 Å, with approximately 300 Å being preferred. Aluminum 16 is then deposited using techniques and procedures well known to one of ordinary skill in the art to a thickness sufficient to fill the first opening. After deposition of the aluminum layer 16, the silicon wafer is subjected to chemical mechanical planarization (CMP) techniques as are well known to one of ordinary skill in the art prior to further fabrication. The fabrication of silicon substrate to form a via level aluminum/copper dual damascene interconnect as shown in FIG. 13 may be accomplished by using depositing, patterning, and planarization techniques and using materials well known to one of ordinary skill in the art and as described above in the embodiments depicted in FIG. 9.

Figure 14:
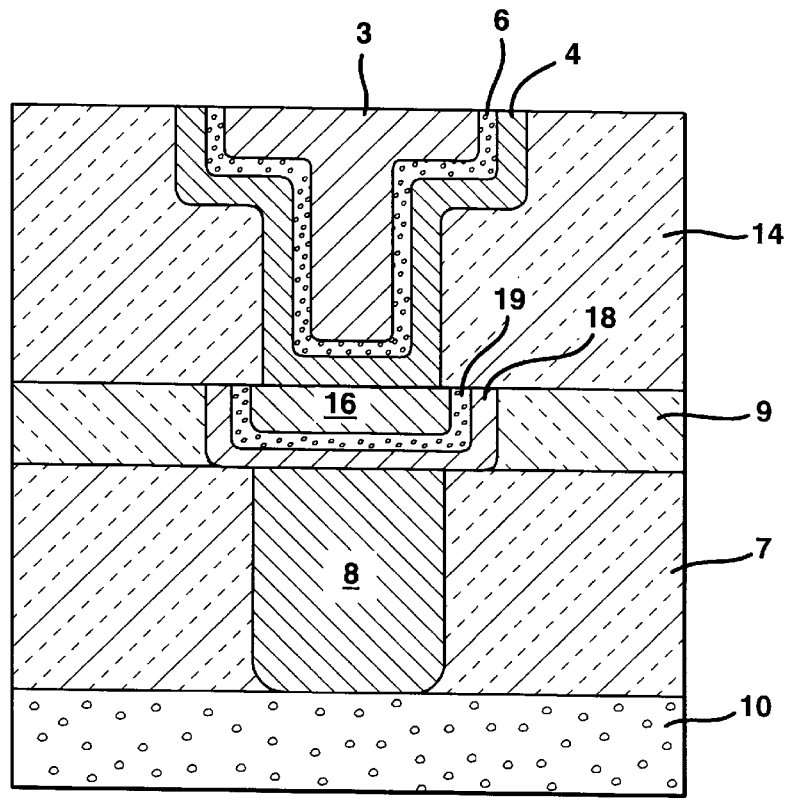
FIG. 14 depicts a cross-section of a via level aluminum/copper dual damascene interconnect having a first insulating layer containing a conductive metal plug, a second insulating layer overlying the first insulating layer and having a first opening, where the first opening lies over at least a part of the conductive metal plug and where the first opening is overlaid with an aluminum diffusion barrier layer, which is in turn overlaid with a wetting layer for aluminum and then filled with an aluminum layer, and a third insulating layer overlying the second insulating layer and having a second opening, where the second opening lies over at least a part of the aluminum layer and where the second opening is overlaid with a copper diffusion barrier layer and which is in turn overlaid with an aluminum wetting layer and then filled with copper, showing the formation a $Cu_nAl$ alloy.

FIG. 14 shows a cross-section of a via level aluminum/copper dual damascene interconnect of the present invention having a first insulating layer 7 containing a conductive metal plug 8, a second insulating layer 9 having a first opening overlying the first insulating layer 7 where the first opening lies over at least a part of the conductive metal plug 8 and where the first opening is overlaid with an aluminum diffusion barrier layer 18 which is then overlaid with a wetting layer for aluminum 19 and then filled with aluminum 16, and a third insulating layer 14 having a second opening overlying the second insulating layer 9 where the second opening lies over at least a part of the aluminum 16 and where the second opening is overlaid with a copper diffusion barrier layer 4 and which is in turn overlaid with an aluminum wetting layer (not shown) and then filled with copper 3, annealed, and caused to reflow as described above in the embodiments depicted in FIG. 1, showing the formation of a $Cu_nAl$ alloy 6 as is described in the embodiment depicted in FIG. 3. The aluminum diffusion barrier layer 18 is typically titanium or titanium nitride and is deposited by PVD or CVD techniques well known to one of ordinary skill in the art and is deposited to a thickness of approximately 100 Å to approximately 800 Å, with approximately 300 Å being preferred. The wetting layer for aluminum 19 typically titanium or titanium nitride and is deposited by PVD techniques well known to one of ordinary skill in the art and is deposited to a thickness of approximately 100 Å to approximately 800 Å, with approximately 300 Å being preferred. As one of ordinary skill in the art will realize, when the wetting layer for aluminum 19 is titanium nitride and the aluminum diffusion barrier layer 18 is titanium, in addition to acting as a diffusion barrier for aluminum, the titanium will also act to increase the electrical contact to the conductive metal plug 8. Aluminum 16 is then deposited as described above in FIG. 13. The fabrication of silicon substrate to form a via level aluminum/copper dual damascene interconnect as shown in FIG. 14 may be accomplished by using deposition, patterning, and planarization techniques and using materials well known to one of ordinary skill in the art and as described above in the embodiments depicted in FIG. 9.

Figure 15:
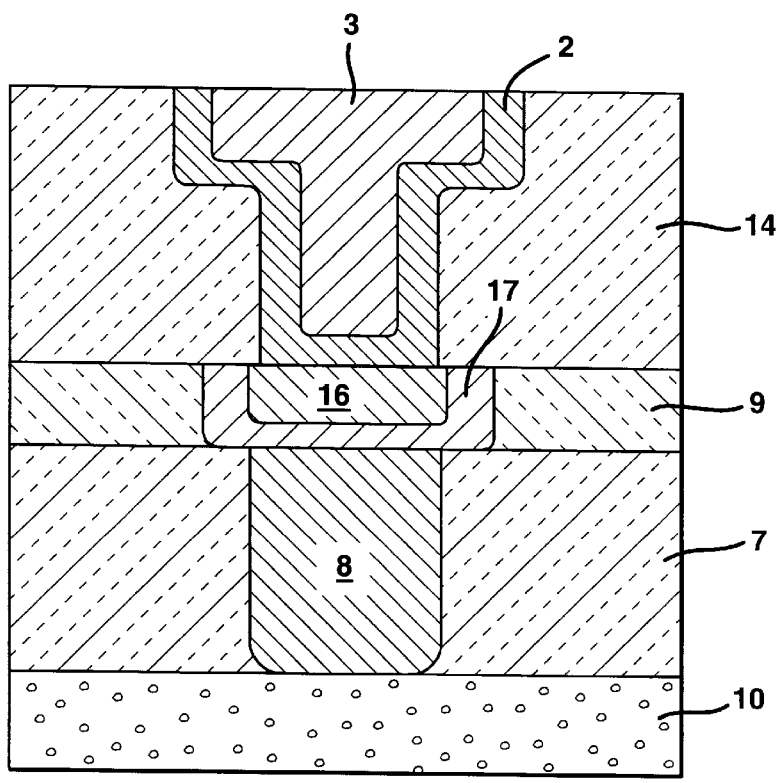
FIG. 15 depicts a cross-section of a via level aluminum/copper dual damascene interconnect having a first insulating layer containing a conductive metal plug, a second insulating layer overlying the first insulating layer and having a first opening, where the first opening lies over at least a part of the conductive metal plug and where the first opening is overlaid with a wetting layer for aluminum and then filled with an aluminum layer, and a third insulating layer overlying the second insulating layer and having a second opening, where the second opening lies over at least a part of the aluminum layer and where the second opening is overlaid with a $Ti_xAl_yN_z$ barrier layer and then filled with copper.

FIG. 15 shows a cross-section of a via level aluminum/copper dual damascene interconnect of the present invention having a first insulating layer 7 containing a conductive metal plug 8, a second insulating layer 9 having a first opening overlying the first insulating layer 7 where the first opening lies over at least a part of the conductive metal plug 8 and where the first opening is overlaid with a wetting layer for aluminum 17 and then filled with aluminum 16 and a third insulating layer 14 having a second opening overlying the second insulating layer 9 where the second opening lies over at least a part of the aluminum 16 and where the second opening is overlaid with a $Ti_xAl_yN_z$ barrier layer 2, the $Ti_xAl_yN_z$ barrier layer 2 optionally doped with oxygen as described previously in FIG. 1, and then filled with copper 3, annealed, and caused to reflow as described above in the description of FIG. 1. The wetting layer for aluminum 17 is as described and as deposited as described in FIG. 13. Aluminum 16 is deposited as described above in FIG. 13. The fabrication of silicon substrate to form a via level aluminum/copper dual damascene interconnect as shown in FIG. 14 may be accomplished by using depositing, patterning, and planarization techniques and using materials well known to one of ordinary skill in the art and as described above in the embodiments depicted in FIG. 9.

Figure 16:
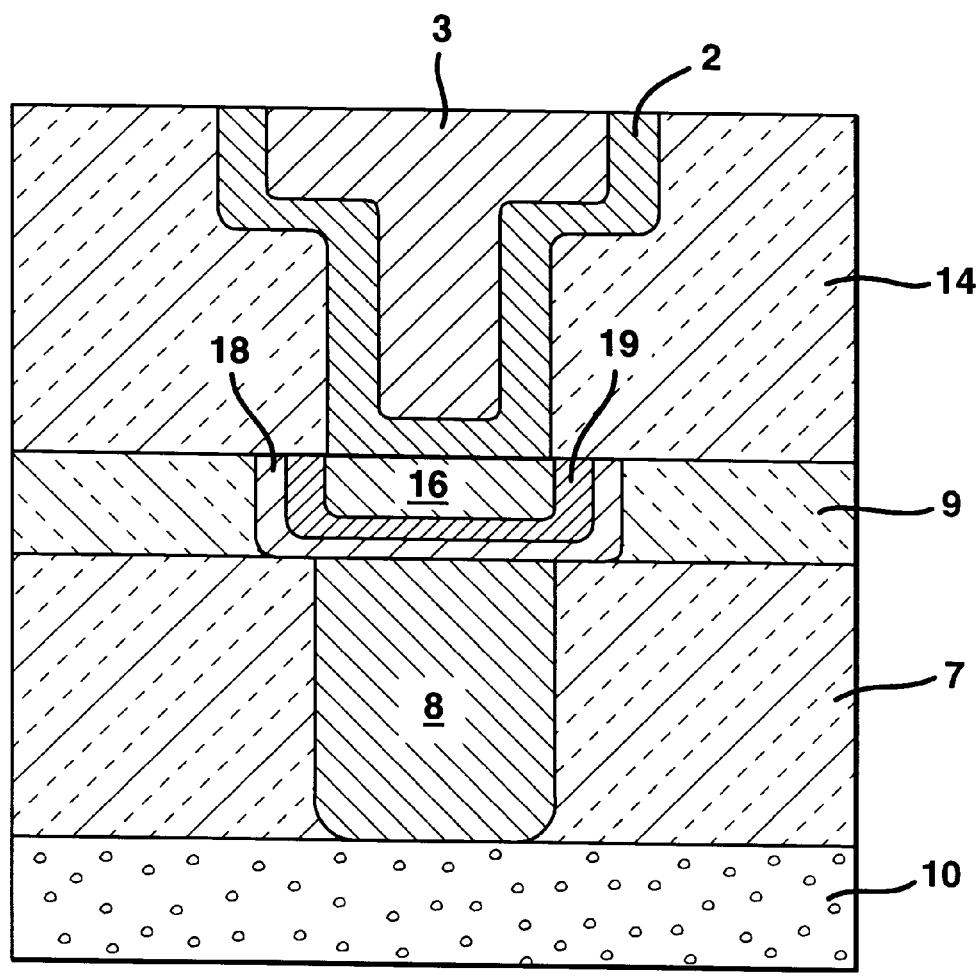
FIG. 16 depicts a cross-section of a vial level aluminum/copper dual damascene interconnect having a first insulating layer containing a conductive metal plug, a second insulating layer overlying the first insulating layer and having a first opening, where the first opening lies over at least a part of the conductive metal plug and where the first opening is overlaid with an aluminum diffusion barrier layer which is in turn overlaid with a wetting layer for aluminum and then filled with an aluminum layer, and a third insulating layer overlying the second insulating layer and having a second opening, where the second opening lies over at least a part of the aluminum layer and where the second opening is overlaid with a $Ti_xAl_yN_z$ barrier layer and then filled with copper.

FIG. 16 shows a cross-section of a via level aluminum/copper dual damascene interconnect of the present invention having a first insulating layer 7 containing a conductive metal plug 8, a second insulating layer 9 having a first opening overlying the first insulating layer 7 where the first opening lies over at least a part of the conductive metal plug 8 and where the first opening is overlaid with an aluminum diffusion barrier layer 18 which is then overlaid with a wetting layer for aluminum 19 and then filled with aluminum 16, which is reflowed during deposition, and a third insulating layer 14 having a second opening overlying the second insulating layer 9 where the second opening lies over at least a part of the aluminum 16 and where the second opening is overlaid with a $Ti_xAl_yN_z$ barrier layer 2, the $Ti_xAl_{yz}$ barrier layer 2 optionally doped with oxygen as described previously in FIG. 1, and then filled with copper 3, annealed, and caused to reflow as described above in the description of FIG. 1. The aluminum diffusion barrier layer 18, wetting layer for aluminum 19, and aluminum 16 are deposited as described and as deposited as in FIG. 14. The fabrication of silicon substrate to form a via level aluminum/copper dual damascene interconnect as shown in FIG. 14 may be accomplished by using depositing, patterning, and planarization techniques and using materials well known to one of ordinary skill in the art and as described above in the embodiments depicted in FIG. 9.

What is claimed is:

1. A method for filling openings in silicon substrates comprising:
   a) depositing a copper diffusion barrier layer on the inside surface of the opening;
   b) depositing an aluminum wetting layer over the copper diffusion barrier layer; and
   c) depositing a copper layer over the aluminum wetting layer to fill the opening.

2. A method according to claim 1 wherein the copper diffusion barrier is selected from the group consisting of $Ti_xAl_yN_z$, TaN, TiN and WN wherein each of x, y, and z is an integer such that each of Ti, Al, and N constitutes greater than 10% of the total atomic composition thereof.

3. A method for filling openings in silicon substrates comprising:
   a) depositing a $Ti_xAl_yN_z$ barrier layer on the inside surface of the opening wherein each of x, y, and z is an integer such that each of Ti, Al, and N constitutes greater than 10% of the total atomic composition thereof, and
   b) depositing a copper layer over the $Ti_xAl_yN_z$ barrier layer to fill the opening.

4. A method according to claim 3 further comprising the step of annealing the $Ti_xAl_yN_z$ barrier layer by subjecting the silicon substrate so formed in an $O_2$ atmosphere prior to the step of depositing the copper layer.

5. A process for forming a contact level dual damascene on a silicon substrate comprising:
   a) providing a first and second insulating layers on the silicon substrate having an opening through said first and second insulating layers;
   b) depositing a refractory metal layer on the inside surface of the opening;
   c) deposing a $Ti_xAl_yN_z$ barrier layer over the refractory metal layer; and
   d) depositing a copper layer of the $Ti_xAl_yN_z$ barrier layer to fill the opening.

6. A process for forming a contact level dual damascene on a silicon substrate comprising:
   a) providing first and second insulating layers on the silicon substrate having an opening through said first and second insulating layers;
   b) depositing a refractory metal layer on the inside surface of the opening;
   c) depositing a copper diffusion barrier layer over the refractory metal layer;
   d) depositing an aluminum wetting layer over the copper diffusion barrier layer; and
   e) depositing a copper layer over the aluminum wetting layer to fill the opening.

7. A process for forming an interconnect on a silicon substrate comprising:
   a) providing a first insulating layer on the silicon substrate having a conductive metal plug therein;
   b) depositing a second insulating layer over the first insulating layer and the conductive metal plug;
   c) patterning the second insulating layer to form a patterned second insulating layer having an opening wherein the opening lies over at least part of the conductive metal plug;
   d) depositing a copper diffusion barrier layer on the inside surface of the opening;
   e) depositing an aluminum wetting layer over the copper diffusion barrier layer;
   f) depositing a copper layer over the aluminum wetting layer to fill the opening and form said interconnect;
   g) annealing the copper layer by subjecting the silicon substrate so formed to an elevated temperature in a vacuum for a period of time less than 5 minutes; and
   h) reflowing the copper.

8. A process according to claim 7 wherein the annealing step is conducted in a gaseous atmosphere.

9. A process according to claim 8 wherein the gaseous atmosphere is a hydrogen atmosphere.

10. A process for forming an interconnect on a silicon substrate comprising:
   a) providing a first insulating layer on the silicon substrate having a conductive metal plug therein;
   b) depositing a second insulating layer over the first insulating layer and the conductive metal plug;
   c) patterning the second insulating layer to form a patterned second insulating layer having an opening wherein the opening lies over at least part of the conductive metal plug;
   d) depositing a $Ti_xAl_yN_z$ barrier layer on the inside surface of the opening wherein each of x, y, and z is an integer such that each of Ti, Al, and N constitutes greater than 10% of the total atomic composition thereof;
   e) depositing a copper layer over the $Ti_xAl_yN_z$ barrier layer to fill the opening and form said interconnect;
   f) annealing the copper layer by subjecting the silicon substrate so formed to an elevated temperature in a vacuum for a period of time less than 5 minutes; and
   g) reflowing the copper.

11. A process according to claim 10 further comprising the step of annealing the $Ti_xAl_yN_z$ barrier layer by subjecting the silicon substrate so formed in an $O_2$ atmosphere prior to the step of depositing the copper layer.

12. A process for forming a via level copper/copper dual damascene interconnect on a silicon substrate comprising:
   a) providing first insulating layer on the silicon substrate having a conductive metal plug therein;
   b) depositing a second insulating layer over the first insulating layer and the conductive metal plug;
   c) patterning the second insulating layer to form a patterned second insulating layer having a first opening wherein the first opening lies over at least part of the conductive metal plug;
   d) depositing a first $Ti_xAl_yN_z$ barrier layer on the inside surface of the first opening wherein each of x, y, and z is an integer such that each of Ti, Al, and N constitutes greater than 10% of the total atomic composition thereof;
   e) depositing a first copper layer over the first $Ti_xAl_yN_z$ barrier layer to fill the first opening;
   f) planarizing the silicon substrate so formed;
   g) depositing a third insulating layer over the second insulating layer and the first copper layer;
   h) patterning the third insulating layer to form a patterned third insulating layer having a second opening wherein the second opening lies over at least part of the first copper layer;
   i) depositing a second $Ti_xAl_yN_z$ barrier layer on the inside surface of the second opening wherein each of x, y, and z is an integer such that each of Ti, Al, and N constitutes greater than 10% of the total atomic composition thereof;
   j) depositing a second copper layer over the second $Ti_xAl_yN_z$ layer to fill the second opening and form said via level copper/copper dual damascene interconnect;
   k) annealing the second copper layer by subjecting the silicon substrate so formed to an elevated temperature in a vacuum for a period of time less than 5 minutes; and
   l) reflowing the second copper layer.

13. A process for forming a via level copper/copper dual damascene interconnect on a silicon substrate comprising:
   a) providing a first insulating layer on the silicon substrate having a conductive metal plug therein;
   b) depositing a second insulating layer over the first insulating layer and the conductive metal plug;
   c) patterning the second insulating layer to form a patterned second insulating layer having a first opening wherein the first opening lies over at least part of the conductive metal plug;
   d) depositing a copper diffusion barrier layer on the inside surface of the opening;
   e) depositing an aluminum wetting layer over the copper diffusion barrier layer;
   f) depositing a first copper layer over the aluminum wetting layer to fill the opening;
   g) planarizing the silicon substrate so formed;
   h) depositing a third insulating layer over the second insulating layer and the first copper layer;
   i) patterning the third insulating layer to form a patterned third insulating layer having a second opening wherein the second opening lies over at least part of the first copper layer;
   j) depositing a $Ti_xAl_yN_z$ barrier layer on the inside surface of the second opening wherein each of x, y, and z is an integer such that each of Ti, Al, and N constitutes greater than 10% of the total atomic composition thereof;
   k) depositing a second copper layer over the $Ti_xAl_yN_z$ barrier layer to fill the second opening and form said via level copper/copper dual damascene interconnect;
   l) annealing the second copper layer by subjecting the silicon substrate so formed to an elevated temperature in a vacuum for a period of time less than 5 minutes; and
   m) reflowing the second copper layer.

14. A process for forming a via level copper/copper dual damascene interconnect on a silicon substrate comprising:
   a) providing a first insulating layer on the silicon substrate having a conductive metal plug therein;
   b) depositing a second insulating layer over the first insulating layer and the conductive metal plug;
   c) patterning the second insulating layer to form a patterned second insulating layer having a first opening wherein the first opening lies over at least part of the conductive metal plug;
   d) depositing a $Ti_xAl_yN_z$ barrier layer on the inside surface of the first opening wherein each of x, y, and z is an integer such that each of Ti, Al, and N constitutes greater than 10% of the total atomic composition thereof;
   e) depositing a first copper layer over the $Ti_xAl_yN_z$ barrier layer to fill the first opening;
   f) planarizing the silicon substrate so formed;
   g) depositing a third insulating layer over the second insulating layer and the first copper layer;
   h) patterning the third insulating layer to form a patterned third insulating layer having a second opening wherein the second opening lies over at least part of the first copper layer;
   i) depositing a copper diffusion barrier layer on the inside surface of the second opening;
   j) depositing an aluminum wetting layer over the copper diffusion barrier layer;
   k) depositing a second copper layer over the aluminum wetting layer to fill the second opening and form said via level copper/copper dual damascene interconnect;

l) annealing the second copper layer by subjecting the silicon substrate so formed to an elevated temperature in a vacuum for a period of time less than 5 minutes; and n) reflowing the second copper layer.

15. A process for forming a via level copper/copper dual damascene interconnect on a silicon substrate comprising:

a) providing a first insulating layer on a silicon substrate having a conductive metal plug therein;

b) depositing a second insulating layer over the first insulating layer and the conductive metal plug;

c) patterning the second insulating layer to form a patterned second insulating layer having a first opening wherein the first opening lies over at least part of the conductive metal plug;

d) depositing a first copper diffusion barrier layer on the inside surface of the first opening;

e) depositing a first aluminum wetting layer over the first copper diffusion barrier layer;

f) depositing a first copper layer over the first aluminum wetting layer to fill the first opening;

g) planarizing the silicon substrate so formed;

h) depositing a third insulating layer over the second insulating layer and the first copper layer;

i) patterning the third insulating layer to form a patterned third insulating layer having a second opening wherein the second opening lies over at least part of the first copper layer;

j) depositing a second copper diffusion barrier layer on the inside surface of the second opening;

k) depositing a second aluminum wetting layer over the second copper diffusion barrier layer;

l) depositing a second copper layer over the second aluminum wetting layer to fill the second opening and form said via level copper/copper dual damascene interconnect;

m) annealing the second copper layer by subjecting the silicon substrate so formed to an elevated temperature in a vacuum for a period of time less than 5 minutes; and n) reflowing the second copper layer.

16. A process for forming a via level aluminum/copper dual damascene interconnect on a silicon substrate comprising:

a) providing a first insulating layer on the silicon substrate having a conductive metal plug therein;

b) depositing a second insulating layer over the first insulating layer and the conductive metal plug;

c) patterning the second insulating layer to form a patterned second insulating layer having a first opening wherein the first opening lies over at least part of the conductive metal plug;

d) depositing a wetting layer for aluminum on the inside surface of the first opening;

e) depositing an aluminum layer over the wetting layer for aluminum to fill the first opening;

f) planarizing the silicon substrate so formed;

g) depositing a third insulating layer over the second insulating layer and the aluminum layer;

h) patterning the third insulating layer to form a patterned third insulating layer having a second opening wherein the second opening lies over at least part of the aluminum layer;

i) depositing a copper diffusion barrier layer on the inside surface of the second opening;

j) depositing an aluminum wetting layer over the copper diffusion barrier layer;

k) depositing a copper layer over the aluminum wetting layer to fill the second opening and form said via level aluminum/copper dual damascene interconnect;

l) annealing the copper layer by subjecting the silicon substrate so formed to an elevated temperature in a vacuum for a period of time less than 5 minutes; and m) reflowing the copper layer.

17. A process for forming a via level aluminum/copper dual damascene interconnect on a silicon substrate comprising:

a) providing a first insulating layer on the silicon substrate having a conductive metal plug therein;

b) depositing a second insulating layer over the first insulating layer and the conductive metal plug;

c) patterning the second insulating layer to form a patterned second insulating layer having a first opening wherein the first opening lies over at least part of the conductive metal plug;

d) depositing an aluminum diffusion barrier layer on the inside surface of the first opening;

e) depositing a wetting layer for aluminum over the aluminum diffusion barrier layer;

f) depositing an aluminum layer over the wetting layer for aluminum to fill the first opening;

g) planarizing the silicon substrate so formed;

h) depositing a third insulating layer over the second insulating layer and the aluminum layer;

i) patterning the third insulating layer to form a patterned third insulating layer having a second opening wherein the second opening lies over at least part of the aluminum layer;

j) depositing a copper diffusion barrier layer on the inside surface of the second opening;

k) depositing an aluminum wetting layer over the copper diffusion barrier layer;

l) depositing a copper layer over the aluminum wetting layer to fill the second opening and form said via level aluminum/copper dual damascene interconnect;

m) annealing the copper layer by subjecting the silicon substrate so formed to an elevated temperature in a vacuum for a period of time less than 5 minutes; and n) reflowing the copper layer.

18. A process for forming a via level aluminum/copper dual damascene interconnect on a silicon substrate comprising:

a) providing a first insulating layer on the silicon substrate having a conductive metal plug therein;

b) depositing a second insulating layer over the first insulating layer and the conductive metal plug;

c) patterning the second insulating layer to form a patterned second insulating layer having a first opening wherein the first opening lies over at least part of the conductive metal plug;

d) depositing a wetting layer for aluminum on the inside surface of the first opening;

e) depositing an aluminum layer over the wetting layer for aluminum to fill the first opening;

f) planarizing the silicon substrate so formed;

g) depositing a third insulating layer over the second insulating layer and the aluminum layer;

h) patterning the third insulating layer to form a patterned third insulating layer having a second opening wherein the second opening lies over at least part of the aluminum layer;

i) depositing a $Ti_xAl_yN_z$ barrier layer on the inside surface of the second opening wherein each of x, y, and z is an integer such that each of Ti, Al, and N constitutes greater than 10% of the total atomic composition thereof, j) depositing a copper layer over the $Ti_xAl_yN_z$ barrier layer to fill the second opening and form said via level aluminum/copper dual damascene interconnect;

k) annealing the copper layer by subjecting the silicon substrate so formed to an elevated temperature in a vacuum for a period of time less than 5 minutes; and l) reflowing the copper layer.

19. A process for forming a via level aluminum/copper dual damascene interconnect on a silicon substrate comprising:

a) providing a first insulating layer on the silicon substrate having a conductive metal plug therein;

b) depositing a second insulating layer over the first insulating layer and the conductive metal plug;

c) patterning the second insulating layer to form a patterned second insulating layer having a first opening wherein the first opening lies over at least part of the conductive metal plug;

d) depositing an aluminum diffusion barrier layer on the inside surface of the first opening;

e) depositing a wetting layer for aluminum over the aluminum diffusion barrier layer;

f) depositing an aluminum layer over the wetting layer for aluminum to fill the opening;

g) planarizing the silicon substrate so formed;

h) depositing a third insulating layer over the second insulating layer and the aluminum layer;

i) patterning the third insulating layer to form a patterned third insulating layer having a second opening wherein the second opening lies over at least part of the aluminum layer;

j) depositing a $Ti_xAl_yN_z$ barrier layer on the inside surface of the second opening wherein each of x, y, and z is an integer such that each of Ti, Al, and N constitutes greater than 10% of the total atomic composition thereof;

k) depositing a copper layer over the $Ti_xAl_yN_z$ barrier layer to fill the second opening and form said via level aluminum/copper dual damascene interconnect;

l) annealing the copper layer by subjecting the silicon substrate so formed to an elevated temperature in a vacuum for a period of time less than 5 minutes; and m) reflowing the copper layer.

20. A silicon structure comprising:

a) an insulating layer deposited over a silicon substrate and having an opening therein;

b) a $Ti_xAl_yN_z$ barrier layer deposited on the inside surface of the opening wherein each of x, y, and z is an integer such that each of Ti, Al, and N constitutes greater than 10% of the total atomic composition thereof, and c) a copper layer deposited over the $Ti_xAl_yN_z$ barrier layer to fill the opening.

21. A silicon structure comprising:

a) an insulating layer deposited over a silicon substrate and having an opening therein;

b) a copper diffusion barrier layer deposited on the inside surface of the opening;

c) an aluminum wetting layer deposited over the copper diffusion barrier layer; and d) a copper layer deposited over the aluminum wetting layer to fill the opening, wherein said aluminum wetting layer consists at least in part of a copper aluminum alloy after the copper layer is deposited over the aluminum wetting layer.

22. A contact level dual damascene comprising:

a) a first insulating layer deposited over a silicon substrate and having an opening therein;

b) a second insulating layer deposited over the first insulating layer and having an opening therein, wherein the opening in the second insulating layer lies over at least part of the opening in the first insulating layer to form an opening through the first and second insulating layers;

c) a refractory metal layer deposited on the inside surface of the opening through the first and second insulating layers;

d) a $Ti_xAl_yN_z$ barrier layer deposited over the refractory metal layer wherein each of x, y, and z is an integer such that each of Ti, Al, and N constitutes greater than 10% of the total atomic composition thereof; and e) a copper layer deposited over the $Ti_xAl_yN_z$ barrier layer to fill the opening through the first and second insulating layers, wherein at least a portion of said silicon substrate lying directly below the refractory metal layer consists at least in part of a refractory metal silicide $MSi_x$ after the refractory metal layer is deposited on the inside surface of the opening through the first and second insulating layers.

23. A contact level dual damascene comprising:

a) a first insulating layer deposited over a silicon substrate and having an opening therein;

b) a second insulating layer deposited over the first insulating layer and having an opening therein, wherein the opening in the second insulating layer lies over at least part of the opening in the first insulating layer to form an opening through the first and second insulating layers;

c) a refractory metal layer deposited on the inside surface of the opening through the first and second insulating layers;

d) a copper diffusion barrier layer deposited over the refractory metal layer;

e) an aluminum wetting layer deposited over the copper diffusion barrier layer; and f) a copper layer deposited over the aluminum wetting layer to fill the opening through the first and second insulating layers, wherein said aluminum layer consists at least in part of a copper aluminum alloy after the copper layer is deposited over the aluminum wetting layer and wherein said at least a portion of the silicon substrate lying directly below the refractory metal layer consists at least in part of a refractory metal silicide $MSi_x$ after the refractory metal layer is deposited on the inside surface of the opening through the first and second insulating layers.

24. An interconnect on a silicon substrate comprising:

a) a first insulating layer on the silicon substrate having a conductive metal plug therein;

b) a second insulating layer deposited over the first insulating layer and the conductive metal plug and having an opening overlying the first insulating layer wherein the opening lies over at least part of the conductive metal plug;

c) a copper diffusion barrier layer deposited on the inside surface of the opening;

d) an aluminum wetting layer deposited over the copper diffusion barrier layer; and e) a copper layer deposited over the aluminum wetting layer to fill the opening;

wherein said aluminum wetting layer consists at least in part of a copper aluminum alloy after the copper layer is deposited over the aluminum wetting layer.

25. An interconnect according to claim 24 wherein the copper diffusion barrier is selected from the group consisting of $Ti_xAl_yN_z$, TaN, TiN and WN wherein each of x, y, and z is an integer such that each of Ti, Al, and N constitutes greater than 10% of the total atomic composition thereof.

26. An interconnect according to claim 24 wherein the copper diffusion barrier layer is between approximately 100 Å to approximately 2000 Å thick.

27. An interconnect according to claim 24 wherein the aluminum layer, consisting at least in part of a copper aluminum alloy, is between approximately 50 Å to approximately 500 Å thick.

28. An interconnect according to claim 24 wherein the conductive metal plug is tungsten.

29. An interconnect according to claim 24 wherein the first insulating layer is borophosphorous silicate glass.

30. An interconnect according to claim 24 wherein the second insulating layer is silicon oxide.

31. An interconnect on a silicon substrate comprising:

a) a first insulating layer on the silicon substrate having a tungsten plug therein;

b) a second insulating layer deposited over the first insulating layer and the tungsten plug and having an opening overlying the first insulating layer, and wherein the opening lies over at least part of the tungsten plug;

c) a $Ti_xAl_yN_z$ barrier layer deposited on the inside surface of the opening wherein each of x, y, and z is an integer such that each of Ti, Al, and N constitutes greater than 10% of the total atomic composition thereof;

d) an aluminum wetting layer deposited over the $Ti_xAl_yN_z$ barrier layer; and e) a copper layer deposited over the aluminum wetting layer to fill the opening, wherein said aluminum wetting layer consists at least in part of a copper aluminum alloy after the copper layer is deposited over the aluminum wetting layer.

32. An interconnect on a silicon substrate comprising:

a) a first insulating layer on the silicon substrate having a conductive metal plug therein;

b) a second insulating layer deposited over the first insulating layer and the conductive metal plug and having an opening overlying the first insulating layer wherein the opening lies over at least part of the conductive metal plug;

c) a $Ti_xAl_yN_z$ barrier layer deposited on the inside surface of the opening wherein each of x, y, and z is an integer such that each of Ti, Al, and N constitutes greater than 10% of the total atomic composition thereof; and d) a copper layer deposited over the $Ti_xAl_yN_z$ barrier layer to fill the opening.

33. An interconnect according to claim 32 wherein the $Ti_xAl_yN_z$ barrier layer is approximately 200 Å to approximately 500 Å thick.

34. An interconnect according to claim 32 wherein the conductive metal plug is tungsten.

35. An interconnect according to claim 32 wherein the $Ti_xAl_yN_z$ barrier layer is doped with oxygen or an oxygen species $O_m$.

36. A via level copper/copper dual damascene interconnect on a silicon substrate comprising:

a) a first insulating layer on a silicon substrate having a conductive metal plug therein;

b) a second insulating layer deposited over the first insulating layer and the conductive metal plug and having a first opening overlying the first insulating layer wherein the first opening lies over at least part of the conductive metal plug;

c) a first $Ti_xAl_yN_z$ barrier layer deposited on the inside surface of the first opening wherein each of x, y, and z is an integer such that each of Ti, Al, and N constitutes greater than 10% of the total atomic composition thereof;

d) a first copper layer deposited over the first $Ti_x$, $Al_yN_z$ barrier layer to fill the first opening;

e) a third insulating layer deposited over the second insulating layer and the first copper layer and having a second opening overlying the second insulating layer wherein the second opening lies over at least part of the first copper layer;

f) a second $Ti_xAl_yN_z$ barrier layer deposited on the inside surface of the second opening wherein each of x, y, and z is an integer such that each of Ti, Al, and N constitutes greater than 10% of the total atomic composition thereof; and g) a second copper layer deposited over the second $Ti_xAl_yN_z$ barrier layer to fill the second opening.

37. A via level copper/copper dual damascene interconnect on a silicon substrate comprising:

a) a first insulating layer on the silicon substrate having a conductive metal plug therein;

b) a second insulating layer deposited over the first insulating layer and the conductive metal plug and having a first opening overlying the first insulating layer wherein the first opening lies over at least part of the conductive metal plug;

c) a copper diffusion barrier layer deposited on the inside surface of the opening;

d) an aluminum wetting layer deposited over the copper diffusion barrier layer;

e) a first copper layer deposited over the aluminum wetting layer to fill the opening;

f) a third insulating layer deposited over the second insulating layer and the first copper layer and having a second opening overlying the second insulating layer wherein the second opening lies over at least part of the first copper layer;

g) a $Ti_xAl_yN_z$ barrier layer deposited on the inside surface of the second opening wherein each of x, y, and z is an integer such that each of Ti, Al, and N constitutes greater than 10% of the total atomic composition thereof; and h) a second copper layer deposited over the $Ti_xAl_yN_z$ barrier layer to fill the second opening, wherein said aluminum wetting layer consists at least in part of a copper aluminum alloy after the first copper layer is deposited over the aluminum wetting layer.

38. A via level copper/copper dual damascene interconnect on a silicon substrate comprising:

a) a first insulating layer on a silicon substrate having a conductive metal plug therein;
b) a second insulating layer deposited over the first insulating layer and the conductive metal plug and having a first opening overlying the first insulating layer wherein the first opening lies over at least a part of the conductive metal plug;
c) a $Ti_xAl_yN_z$ barrier layer deposited on the inside surface of the first opening wherein each of x, y, and z is an integer such that each of Ti, Al, and N constitutes greater than 10% of the total atomic composition thereof;
d) a first copper layer deposited over the $Ti_xAl_yN_z$ barrier layer to fill the first opening;
e) a third insulating layer deposited over the second insulating layer and the first copper layer and having a second opening overlying the second insulating layer wherein the second opening lies over at least part of the first copper layer;
f) a copper diffusion barrier layer deposited on the inside surface of the second opening;
g) an aluminum wetting layer deposited over the copper diffusion barrier layer; and
h) a second copper layer deposited over the aluminum wetting layer to fill the second opening, wherein said aluminum wetting layer consists at least in part of a copper aluminum alloy after the second copper layer is deposited over the aluminum wetting layer.

39. A via level copper/copper dual damascene interconnect on a silicon substrate comprising:
a) a first insulating layer on the silicon substrate having a conductive metal plug therein;
b) a second insulating layer deposited over the first insulating layer and the conductive metal plug and having a first opening overlying the first insulating layer wherein the first opening lies over at least part of the conductive metal plug;
c) a first copper diffusion barrier layer deposited on the inside surface of the first opening;
d) a first aluminum wetting layer deposited over the first copper diffusion barrier layer;
e) a first copper layer deposited over the first aluminum wetting layer to fill the first opening;
f) a third insulating layer deposited over the second insulating layer and the first copper layer and having a second opening overlying the second insulating layer wherein the second opening lies over at least part of the first copper layer;
g) a second copper diffusion barrier layer on the inside surface of the second opening;
h) a second aluminum wetting layer deposited over the second copper diffusion barrier layer; and
i) a second copper layer deposited over the second aluminum wetting layer to fill the second opening, wherein said first aluminum wetting layer consists at least in part of a first copper aluminum alloy after the first copper layer is deposited over the first aluminum wetting layer and wherein said second aluminum wetting layer consists at least in part of a second copper aluminum alloy after the second copper layer is deposited over the second aluminum wetting layer.

40. A via level aluminum/copper dual damascene interconnect on a silicon substrate comprising:
a) a first insulating layer on the silicon substrate having a conductive metal plug therein;
b) a second insulating layer deposited over the first insulating layer and the conductive metal plug and having a first opening overlying the first insulating layer wherein the first opening lies over at least part of the conductive metal plug;
c) a wetting layer for aluminum deposited on the inside surface of the first opening;
d) an aluminum layer deposited over the wetting layer for aluminum to fill the first opening;
e) a third insulating layer deposited over the second insulating layer and the aluminum layer and having a second opening overlying the second insulating layer wherein the second opening lies over at least part of the aluminum layer;
f) a copper diffusion barrier layer deposited on the inside surface of the second opening;
g) an aluminum wetting layer deposited over the copper diffusion barrier layer; and
h) a copper layer over the aluminum wetting layer to fill the second opening, wherein said aluminum wetting layer consists at least in part of a copper aluminum alloy after the copper layer is deposited over the aluminum wetting layer.

41. A via level aluminum/copper dual damascene interconnect on a silicon substrate comprising:
a) a first insulating layer on the silicon substrate having a conductive metal plug therein;
b) a second insulating layer over the first insulating layer and the conductive metal plug and having a first opening overlying the first insulating layer wherein the first opening lies over at least part of the conductive metal plug;
c) an aluminum diffusion barrier layer deposited on the inside surface of the first opening;
d) a wetting layer for aluminum deposited over the aluminum diffusion barrier layer;
e) an aluminum layer deposited over the wetting layer for aluminum to fill the first opening;
f) a third insulating layer deposited over the second insulating layer and the aluminum layer and having a second opening overlying the second insulating layer wherein the second opening lies over at least part of the aluminum layer;
g) a copper diffusion barrier layer deposited on the inside surface of the second opening;
h) a aluminum wetting layer deposited over the copper diffusion barrier layer; and
i) a copper layer deposited over the aluminum wetting layer to fill the second opening, wherein said aluminum wetting layer consists at least in part of a copper aluminum alloy after the copper layer is deposited over the aluminum wetting layer.

42. A via level aluminum/copper dual damascene interconnect on a silicon substrate comprising:
a) a first insulating layer on the silicon substrate having a conductive metal plug therein;
b) a second insulating layer over the first insulating layer and the conductive metal plug and having a first opening overlying the first insulating layer wherein the first opening lies over at least part of the conductive metal plug;
c) a wetting layer for aluminum deposited on the inside surface of the first opening;
d) an aluminum layer deposited over the wetting layer for aluminum to fill the first opening;

e) a third insulating layer deposited over the second insulating layer and the aluminum layer and having a second opening overlying the second insulating layer wherein the second opening lies over at least part of the aluminum layer;

f) a $Ti_xAl_yN_z$ barrier layer deposited on the inside surface of the second opening wherein each of x, y, and z is an integer such that each of Ti, Al, and N constitutes greater than 10% of the total atomic composition thereof; and g) a copper layer over the $Ti_xAl_yN_z$ barrier layer to fill the second opening.

43. A via level aluminum/copper dual damascene interconnect on a silicon substrate comprising:

a) a first insulating layer on the silicon substrate having a conductive metal plug therein;

b) a second insulating layer deposited over the first insulating layer and the conductive metal plug and having a first opening overlying the first insulating layer wherein the first opening lies over at least part of the conductive metal plug;

c) an aluminum diffusion barrier layer deposited on the inside surface of the first opening;

d) a wetting layer for aluminum deposited over the aluminum diffusion barrier layer;

e) an aluminum layer deposited over the wetting layer for aluminum to fill the opening;

f) a third insulating layer deposited over the second insulating layer and the aluminum layer and having a second opening overlying the second insulating layer wherein the second opening lies over at least part of the aluminum layer;

g) a $Ti_xAl_yN_z$ barrier layer deposited on the inside surface of the second opening wherein each of x, y, and z is an integer such that each of Ti, Al, and N constitutes greater than 10% of the total atomic composition thereof; and h) a copper layer deposited over the $Ti_xAl_yN_z$ barrier layer to fill the second opening.

44. An semiconductor device comprising:

a) a silicon substrate;

a) a first insulating layer on said silicon substrate having a conductive metal plug therein;

b) a second insulating layer deposited over the first insulating layer and the conductive metal plug and having an opening overlying the first insulating layer wherein the opening lies over at least part of the conductive metal plug;

c) a copper diffusion barrier layer deposited on the inside surface of the opening;

d) an aluminum wetting layer deposited over the copper diffusion barrier layer; and e) a copper layer deposited over the aluminum wetting layer to fill the opening, wherein said aluminum wetting layer consists at least in part of a copper aluminum alloy after the copper layer is deposited over the aluminum wetting layer.

45. An semiconductor device according to claim 44 wherein the copper diffusion barrier is selected from the group consisting of $Ti_xAl_yN_z$, TaN, TiN and WN wherein each of x, y, and z is an integer such that each of Ti, Al, and N constitutes greater than 10% of the total atomic composition thereof.

46. An semiconductor device according to claim 44 wherein the copper diffusion barrier layer is between approximately 100 Å to approximately 2000 Å thick.

47. A semiconductor device according to claim 44 wherein the aluminum layer, consisting at least in part of a copper aluminum alloy, is between approximately 50 Å to approximately 700 Å thick.

48. A semiconductor device according to claim 44 wherein the conductive metal plug is tungsten.

49. An semiconductor device comprising:

a) a silicon substrate;

b) a first insulating layer on said silicon substrate having a tungsten plug therein;

c) a second insulating layer deposited over the first insulating layer and the tungsten plug and having an opening overlying the first insulating layer wherein the opening lies over at least part of the tungsten plug;

d) a $Ti_xAl_yN_z$ barrier layer deposited on the inside surface of the opening wherein each of x, y, and z is an integer such that each of Ti, Al, and N constitutes greater than 10% of the total atomic composition thereof;

e) an aluminum wetting layer deposited over the $Ti_xAl_yN_z$ barrier layer; and f) a copper layer deposited over the aluminum wetting layer to fill the opening, wherein said aluminum wetting layer consists at least in part of a copper aluminum alloy after the copper layer is deposited over the aluminum wetting layer.

50. A semiconductor device comprising:

a) a silicon substrate;

b) a first insulating layer on said silicon substrate having a conductive metal plug therein;

c) a second insulating layer deposited over the first insulating layer and the conductive metal plug and having an opening overlying the first insulating layer wherein the opening lies over at least part of the conductive metal plug;

d) a $Ti_xAl_yN_z$ barrier layer deposited on the inside surface of the opening wherein each of x, y, and z is an integer such that each of Ti, Al, and N constitutes greater than 10% of the total atomic composition thereof; and e) a copper layer deposited over the $Ti_xAl_yN_z$ barrier layer to fill the opening.

51. A semiconductor device according to claim 50 wherein the $Ti_xAl_yN_z$ layer is between approximately 100 Å to approximately 2000 Å thick.

52. A semiconductor device according to claim 50 wherein the conductive metal plug is tungsten.

53. A semiconductor device according to claim 50 wherein the $Ti_xAl_yN_z$ layer is doped with oxygen or an oxygen species $O_m$.

54. A semiconductor device comprising:

b) a silicon substrate;

b) a first insulating layer on said silicon substrate having a conductive metal plug therein;

c) a second insulating layer deposited over the first insulating layer and the conductive metal plug and having a first opening overlying the first insulating layer wherein the first opening lies over at least part of the conductive metal plug;

d) a first $Ti_xAl_yN_z$ barrier layer deposited on the inside surface of the first opening wherein each of x, y, and z is an integer such that each of Ti, Al, and N constitutes greater than 10% of the total atomic composition thereof;

e) a first copper layer deposited over the first $Ti_xAl_yN_z$ layer to fill the first opening;

f) a third insulating layer deposited over the second insulating layer and the first copper layer and having a second opening overlying the second insulating layer wherein the second opening lies over at least part of the first copper layer;

g) a second $Ti_xAl_yN_z$ barrier layer deposited on the inside surface of the second opening wherein each of x, y, and z is an integer such that each of Ti, Al, and N constitutes greater than 10% of the total atomic composition thereof; and h) a second copper layer deposited over the second $Ti_xAl_yN_z$ barrier layer to fill the second opening.

55. A semiconductor device comprising:

a) a silicon substrate;

b) a first insulating layer on said silicon substrate having a conductive metal plug therein;

c) a second insulating layer deposited over the first insulating layer and the conductive metal plug and having a first opening overlying the first insulating layer wherein the first opening lies over at least part of the conductive metal plug;

d) a copper diffusion barrier layer deposited on the inside surface of the opening;

e) an aluminum wetting layer deposited over the copper diffusion barrier layer;

f) a first copper layer deposited over the aluminum wetting layer to fill the opening;

g) a third insulating layer deposited over the second insulating layer and the first copper layer and having a second opening overlying the second insulating layer wherein the second opening lies over at least part of the first copper layer;

h) a $Ti_xAl_yN_z$ barrier layer deposited on the inside surface of the second opening wherein each of x, y, and z is an integer such that each of Ti, Al, and N constitutes greater than 10% of the total atomic composition thereof; and i) a second copper layer deposited over the $Ti_xAl_yN_z$ barrier layer to fill the second opening, wherein said aluminum wetting layer consists at least in part of a copper aluminum alloy after the first copper layer is deposited over the aluminum wetting layer.

56. A semiconductor device comprising:

a) a silicon substrate;

b) a first insulating layer on said silicon substrate having a conductive metal plug therein;

c) a second insulating layer deposited over the first insulating layer and the conductive metal plug and having a first opening overlying the first insulating layer wherein the first opening lies over at least a part of the conductive metal plug;

d) a $Ti_xAl_yN_z$ barrier layer deposited on the inside surface of the first opening wherein each of x, y, and z is an integer such that each of Ti, Al, and N constitutes greater than 10% of the total atomic composition thereof;

e) a first copper layer deposited over the $Ti_xAl_yN_z$ barrier layer to fill the first opening;

f) a third insulating layer deposited over the second insulating layer and the first copper layer and having a second opening overlying the second insulating layer wherein the second opening lies over at least part of the first copper layer;

g) a copper diffusion barrier layer deposited on the inside surface of the second opening;

h) an aluminum wetting layer deposited over the copper diffusion barrier layer; and i) a second copper layer deposited over the aluminum wetting layer to fill the second opening, wherein said aluminum wetting layer consists at least in part of a copper aluminum alloy after the second copper layer is deposited over the aluminum wetting layer.

57. A semiconductor device comprising:

a) a silicon substrate;

b) a first insulating layer on said silicon substrate having a conductive metal plug therein;

c) a second insulating layer deposited over the first insulating layer and the conductive metal plug and having a first opening overlying the first insulating layer wherein the first opening lies over at least part of the conductive metal plug;

d) a first copper diffusion barrier layer deposited on the inside surface of the first opening;

e) a first aluminum wetting layer deposited over the first copper diffusion barrier layer;

f) a first copper layer deposited over the first aluminum wetting layer to fill the first opening;

g) a third insulating layer deposited over the second insulating layer and the first copper layer and having a second opening overlying the second insulating layer wherein the second opening lies over at least part of the first copper layer;

h) a second copper diffusion barrier layer on the inside surface of the second opening;

i) a second aluminum wetting layer deposited over the second copper diffusion barrier layer; and j) a second copper layer deposited over the second aluminum wetting layer to fill the second opening, wherein said first aluminum wetting layer consists at least in part of a first copper aluminum alloy after the first copper layer is deposited over the first aluminum wetting layer and wherein said second aluminum wetting layer consists at least in part of a second copper aluminum alloy after the second copper layer is deposited over the second aluminum wetting layer.

58. A semiconductor device comprising:

a) a silicon substrate;

b) a first insulating layer on said silicon substrate having a conductive metal plug therein;

c) a second insulating layer deposited over the first insulating layer and the conductive metal plug and having a first opening overlying the first insulating layer wherein the first opening lies over at least part of the conductive metal plug;

d) a wetting layer for aluminum deposited on the inside surface of the first opening;

e) an aluminum layer deposited over the wetting layer for aluminum to fill the first opening;

f) a third insulating layer deposited over the second insulating layer and the aluminum layer and having a second opening overlying the second insulating layer wherein the second opening lies over at least part of the aluminum layer;

g) a copper diffusion barrier layer deposited on the inside surface of the second opening;

h) an aluminum wetting layer deposited over the copper diffusion barrier layer; and i) a copper layer over the aluminum wetting layer to fill the second opening, wherein said aluminum wetting layer consists at least in part of a copper aluminum alloy after the copper layer is deposited over the aluminum wetting layer.

59. A semiconductor device comprising:
   a) a silicon substrate;
   b) a first insulating layer on said silicon substrate having a conductive metal plug therein;
   c) a second insulating layer over the first insulating layer and the conductive metal plug and having a first opening overlying the first insulating layer wherein the first opening lies over at least part of the conductive metal plug;
   d) an aluminum diffusion barrier layer deposited on the inside surface of the first opening;
   e) a wetting layer for aluminum deposited over the aluminum diffusion barrier layer;
   f) an aluminum layer deposited over the wetting layer for aluminum to fill the first opening;
   g) a third insulating layer deposited over the second insulating layer and the aluminum layer and having a second opening overlying the second insulating layer wherein the second opening lies over at least part of the aluminum layer;
   h) a copper diffusion barrier layer deposited on the inside surface of the second opening;
   i) a aluminum wetting layer deposited over the copper diffusion barrier layer; and
   j) a copper layer deposited over the aluminum wetting layer to fill the second opening,
wherein said aluminum wetting layer consists at least in part of a copper aluminum alloy after the copper layer is deposited over the aluminum wetting layer.

60. A semiconductor device comprising:
   a) a silicon substrate;
   b) a first insulating layer on said silicon substrate having a conductive metal plug therein;
   c) a second insulating layer over the first insulating layer and the conductive metal plug and having a first opening overlying the first insulating layer wherein the first opening lies over at least part of the conductive metal plug;
   d) a wetting layer for aluminum deposited on the inside surface of the first opening;
   e) an aluminum layer deposited over the wetting layer for aluminum to fill the first opening;
   f) a third insulating layer deposited over the second insulating layer and the aluminum layer and having a second opening overlying the second insulating layer wherein the second opening lies over at least part of the aluminum layer;
   g) a $Ti_xAl_yN_z$ barrier layer deposited on the inside surface of the second opening wherein each of x, y, and z is an integer such that each of Ti, Al, and N constitutes greater than 10% of the total atomic composition thereof; and
   h) a copper layer over the $Ti_xAl_yN_z$ barrier layer to fill the second opening.

61. A semiconductor device comprising:
   a) a silicon substrate;
   b) a first insulating layer on said silicon substrate having a conductive metal plug therein;
   c) a second insulating layer deposited over the first insulating layer and the conductive metal plug and having a first opening overlying the first insulating layer wherein the first opening lies over at least part of the conductive metal plug;
   d) an aluminum diffusion barrier layer deposited on the inside surface of the first opening;
   e) a wetting layer for aluminum deposited over the aluminum diffusion barrier layer;
   f) an aluminum layer deposited over the wetting layer for aluminum to fill the opening;
   g) a third insulating layer deposited over the second insulating layer and the aluminum layer and having a second opening overlying the second insulating layer wherein the second opening lies over at least part of the aluminum layer;
   h) a $Ti_xAl_yN_z$ barrier layer deposited on the inside surface of the second opening wherein each of x, y, and z is an integer such that each of Ti, Al, and N constitutes greater than 10% of the total atomic composition thereof; and
   i) a copper layer deposited over the $Ti_xAl_yN_z$ barrier layer to fill the second opening.

* * * * *

UNITED STATES PATENT AND TRADEMARK OFFICE
CERTIFICATE OF CORRECTION

PATENT NO : 5,939,788
DATED : August 17, 1999
INVENTOR(S): Allen McTeer

It is certified that error appears in the above-identified patent and that said Letters Patent is hereby corrected as shown below:

In the title, second occurrence "WITH COOPER" should read - - WITH COPPER- -.
Col. 17, line 40, "$Ti_xAl_xN_z$" should read - - $Ti_xAl_yN_z$ - -.
Col. 23, line 49, "$Ti_xAl_{yz}$" should read - - $Ti_xAl_yN_z$ - -.
Col. 29, claim 18, line 9, "thereof," should read - - thereof;- -.
Col. 29, claim 20, line 62, "thereof, and" should read - - thereof; and- -.
Col. 36, claim 54, line 52, " b) a silicon" should read - - a) a silicon- -.
Col. 37, claim 56, line 58, " thereof," should read - - thereof;- -.

Signed and Sealed this

Sixth Day of March, 2001

Attest:

NICHOLAS P. GODICI

*Attesting Officer*    *Acting Director of the United States Patent and Trademark Office*